(12) United States Patent
Kerr

(10) Patent No.: US 8,432,016 B1
(45) Date of Patent: Apr. 30, 2013

(54) STACKED BODY-CONTACTED FIELD EFFECT TRANSISTOR

(75) Inventor: Daniel Charles Kerr, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 294 days.

(21) Appl. No.: 12/846,483

(22) Filed: Jul. 29, 2010

Related U.S. Application Data

(60) Provisional application No. 61/229,508, filed on Jul. 29, 2009.

(51) Int. Cl.
*H01L 27/10* (2006.01)
*H01L 29/00* (2006.01)

(52) U.S. Cl.
USPC .......................................... 257/506; 257/206

(58) Field of Classification Search .......... 257/506–510, 257/202–206, E21.546, E23.002
See application file for complete search history.

(56) References Cited

U.S. PATENT DOCUMENTS

| | | | | |
|---|---|---|---|---|
| 5,734,192 | A * | 3/1998 | Sengle et al. | 257/506 |
| 6,563,366 | B1 * | 5/2003 | Kohama | 257/275 |
| 2009/0174027 | A1 * | 7/2009 | Tilke | 257/513 |
| 2009/0302357 | A1 * | 12/2009 | Luk et al. | 257/288 |

OTHER PUBLICATIONS

Kelly, D. et al., "The state-of-the-art of silicon-on-sapphire CMOS RF switches," 2005 Compound Semiconductor Integrated Circuit Symposium, Oct. 30-Nov. 2, 2005, pp. 200-203, IEEE.
McKay, T. et al., "Linear cellular antenna switch for highly-integrated SOI front-end," 2007 IEEE International SOI Conference, Oct. 1-4, 2007, pp. 125-126, IEEE.
Shifrin, M.B. et al., "Monolithic FET structures for High-Power Control Component Applications," IEEE Transactions on Microwave Theory and Techniques, Dec. 1989, vol. 37, pp. 2134-2141, IEEE.
Tinella, C. et al., "0.13 μm CMOS SOI SP6TAntenna Switch for Multi-Standard Handsets," Digest of Papers 2006 Topical Meeting on Silicon Monolithic Integrated Circuits in RF Systems, Jan. 18-20, 2006, 59-61, IEEE.

* cited by examiner

*Primary Examiner* — Cuong Q Nguyen
(74) *Attorney, Agent, or Firm* — Withrow & Terranova, P.L.L.C.

(57) ABSTRACT

The present disclosure relates to a stacked body-contacted field effect transistor (FET) that includes multiple body-contacted FETs coupled in series and a lateral isolation band encircling a periphery of the multiple FETs. The multiple FETs include a first end FET having a first body, which is not directly connected to any body of any other of the multiple FETs, and a second end FET having a second body, which is not directly connected to any body of any other of the multiple FETs. The multiple FETs may include inner FETs that incorporate merged source-drains to save space. By keeping the bodies electrically separated from one another, the full benefits of body-contacting may be realized. However, by incorporating multiple FETs within a single lateral isolation band further saves space.

19 Claims, 19 Drawing Sheets

US 8,432,016 B1

STACKED BODY-CONTACTED FIELD EFFECT TRANSISTOR

This application claims the benefit of provisional patent application Ser. No. 61/229,508, filed Jul. 29, 2009, the disclosure of which is hereby incorporated herein by reference in its entirety.

FIELD OF THE DISCLOSURE

Embodiments of the present disclosure relate to semiconductor and silicon-on-insulator (SOI) technologies and field effect transistors (FETs), all of which may be used in RF communications circuits.

BACKGROUND OF THE DISCLOSURE

As technology progresses, wireless communications devices, such as smart phones, wireless capable computers, or the like, are becoming increasingly integrated, feature rich, and complex. Such wireless communications devices rely on semiconductor technologies, such as silicon based technologies, which are evolving toward smaller circuit geometries, lower power consumption, higher operating speeds, and increased complexity. Complementary metal oxide semiconductor (CMOS) technology is an example of a silicon based technology. Further, wireless communications devices may need to support multiple communications bands, multiple communications modes, multiple communications protocols, and the like. As such, wireless communications devices may need multiple RF switches to select between different RF circuits depending on which communications bands, modes, and protocols are in use. Such complex RF systems may place strict linearity, insertion loss, and isolation demands on the RF switches.

In general, RF switches having semiconductor-based switching elements may have a trade-off between insertion loss and isolation. RF switches that must handle high power levels may require low insertion losses. In order to achieve low insertion loss and high power handling capability, the size of circuit elements within an RF switch may be relatively large. However, such large circuit elements may be associated with relatively large capacitances, which may decrease isolation. Further, multiple large capacitances may have non-linearities, which may degrade linearity of the RF switch. Field effect transistors (FETs) may provide many of the characteristics needed to provide a good RF switch. However, when handling high power levels, single FETs may not have all of the necessary characteristics needed for an RF switch. As a result, stacked FETs may be needed for an RF switch. Thus, there is a need for stacked FETs that are compact and can be used to form an RF switch that improves the trade-off between insertion loss and isolation, has good linearity performance, operates over multiple frequency bands, or any combination thereof.

SUMMARY OF THE EMBODIMENTS

The present disclosure relates to a stacked body-contacted field effect transistor (FET) that includes multiple body-contacted FETs coupled in series and a lateral isolation band encircling a periphery of the multiple FETs. The multiple FETs include a first end FET having a first body, which is not directly connected to any body of any other of the multiple FETs, and a second end FET having a second body, which is not directly connected to any body of any other of the multiple FETs. The multiple FETs may include inner FETs that incorporate merged source-drains to save space. By keeping the bodies electrically separated from one another, the full benefits of body-contacting may be realized. However, incorporating multiple FETs within a single lateral isolation band further saves space. Each of the multiple FETs is body-contacted and may receive reverse body biasing when the FET is in an OFF state, thereby reducing an OFF state drain-to-source capacitance of the FET.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

Figure 1:
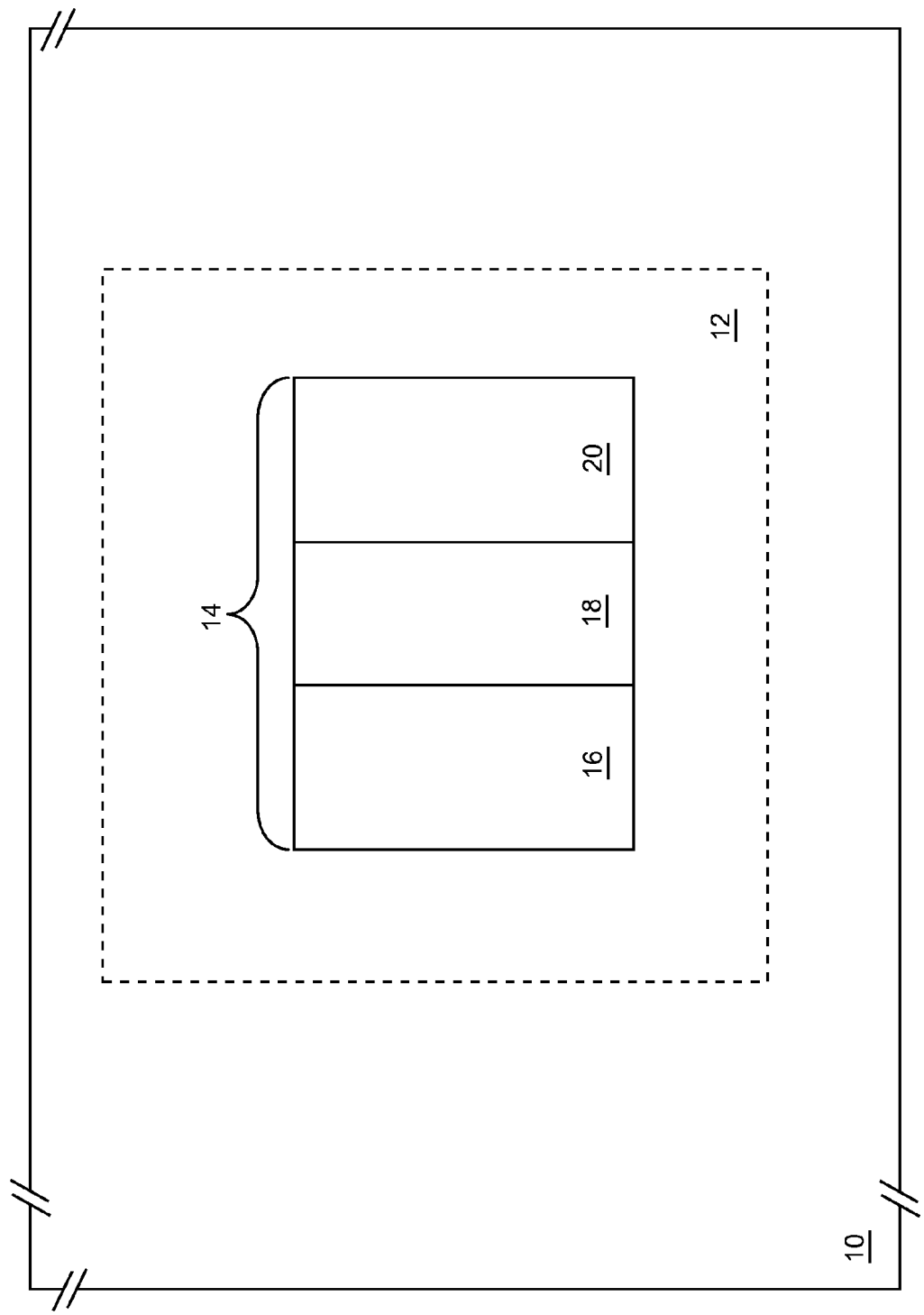
FIG. 1 shows a top view of a conventional substrate, which is used to form a floating-body field effect transistor (FET) element according to the prior art.

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a stacked body-contacted field effect transistor (FET) that includes multiple body-contacted FETs coupled in series and a lateral isolation band encircling a periphery of the multiple FETs. The multiple FETs include a first end FET having a first body, which is not directly connected to any body of any other of the multiple FETs, and a second end FET having a second body, which is not directly connected to any body of any other of the multiple FETs. The multiple FETs may include inner FETs that incorporate merged source-drains to save space. By keeping the bodies electrically separated from one another, the full benefits of body-contacting may be realized. However, incorporating multiple FETs within a single lateral isolation band further saves space. Each of the multiple FETs is body-contacted and may receive reverse body biasing when the FET is in an OFF state, thereby reducing an OFF state drain-to-source capacitance of the FET.

The FETs may be formed using a thin-film semiconductor device layer, which is part of a thin-film semiconductor die. Conduction paths between the FETs through the thin-film semiconductor device layer and through a substrate of the thin-film semiconductor die may be substantially eliminated by using insulating materials. Elimination of the conduction paths allows an RF signal across an RF switch to be divided across the series coupled FETs, such that each FET is subjected to only a portion of the RF signal. Further, each FET is body-contacted and may receive reverse body biasing when the RF switch is in an OFF state, thereby reducing an OFF state drain-to-source capacitance of each FET. The combination of dividing the RF signal and reverse body biasing each FET when the RF switch is in an OFF state may improve the trade-off between insertion loss and isolation, may improve linearity performance, and may enable the RF switch to operate over multiple frequency bands.

Thin-film semiconductor dies may typically be used in conjunction with complementary metal oxide semiconductor (CMOS) processes, which may be used to fabricate high performance microprocessors due to comparatively low source-to-body and drain-to-body junction capacitances. However, low source-to-body and drain-to-body junction capacitances may be beneficial in certain RF circuits, such as RF switches. Low source-to-body and drain-to-body junction capacitances may provide a low OFF state drain-to-source capacitance of an FET. Further, by using insulating materials to completely surround each FET in the RF switch; a body, a source, and a drain of each FET may be isolated from the substrate and may be isolated from other devices, including other FETs, via the thin-film semiconductor device layer.

During the OFF state of the RF switch, a voltage may be applied between the body and the source of each FET to reverse bias the body and the source, and a voltage may be applied between the body and the drain of each FET to reverse bias the body and the drain to body-contact and reverse body bias the FET. By reverse biasing the body and the source, the source-to-body junction capacitance may be further reduced, and by reverse biasing the body and the drain, the drain-to-body junction capacitance may be further reduced, thereby further reducing the OFF state drain-to-source capacitance of each FET. Such junction capacitance reductions may further improve the trade-off between insertion loss and isolation, may further improve linearity performance, and may further enable the RF switch to operate over multiple frequency bands. The improved linearity performance of the RF switch may be based on reduced harmonic distortion of the RF switch or reduced intermodulation distortion.

In addition, for CMOS processes, maximum drain-to-source voltage ratings may be between about one volt and about five volts, depending on the technology. However, the RF signal across the RF switch when the RF switch is in the OFF state may be significantly larger than the maximum drain-to-source voltage ratings. Therefore, the RF switch may include multiple body-contacted FETs coupled in series to divide the RF signal across the series-coupled FETs. The division of the RF signal needs to be reasonably balanced during the OFF state and during transitions between the OFF state and an ON state to avoid exceeding maximum drain-to-source voltage ratings. As mentioned above, conduction paths between the FETs through the thin-film semiconductor device layer and through the substrate of the thin-film semiconductor die may be substantially eliminated by using insulating materials, thereby helping to avoid exceeding maximum drain-to-source voltage ratings.

FIG. 1 shows a top view of a conventional substrate 10, which is used to form a floating-body FET element 12 according to the prior art. The floating-body FET element 12 includes an active region 14, which is formed in the conventional substrate 10. The active region 14 includes a conventional source 16, a floating body 18, and a conventional drain 20. The floating body 18 is between the conventional source 16 and the conventional drain 20 and provides a channel for the floating-body FET element 12. In one configuration, the conventional source 16 and the conventional drain 20 include N-type semiconductor material, and the floating body 18 includes P-type semiconductor material. In an alternate configuration, the conventional source 16 and the conventional drain 20 include P-type semiconductor material, and the floating body 18 includes N-type semiconductor material.

Figure 2:
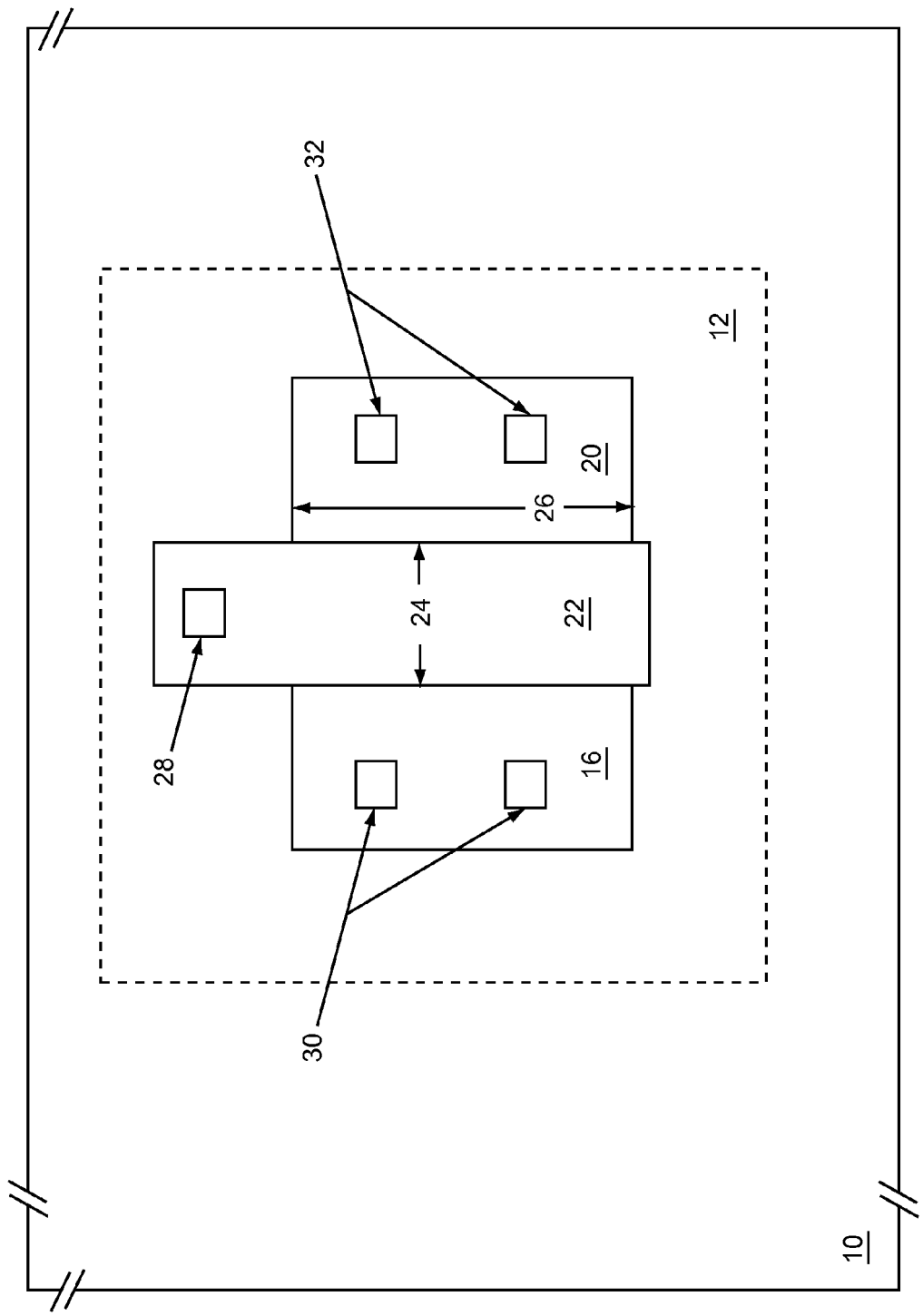
FIG. 2 shows a top view of details of the floating-body FET element illustrated in FIG. 1 according to the prior art.

FIG. 2 shows a top view of details of the floating-body FET element 12 illustrated in FIG. 1 according to the prior art. The floating-body FET element 12 includes a conventional gate 22 over the conventional substrate 10. The conventional gate 22 has a gate length 24 and a gate width 26 over the channel of the floating-body FET element 12. Further, the conventional gate 22 may completely cover the floating body 18 as shown. The conventional gate 22 may have a gate contact 28, the conventional source 16 may have source contacts 30, and the conventional drain 20 may have drain contacts 32. The gate, the source, and the drain contacts 28, 30, 32 provide electrical connectivity to the conventional gate 22, the conventional source 16, and the conventional drain 20, respectively. The floating body 18 has no electrical contacts and is electrically coupled to other devices only through the conventional substrate 10, the conventional gate 22, the conventional source 16, the conventional drain 20, or any combination thereof.

Figure 3:
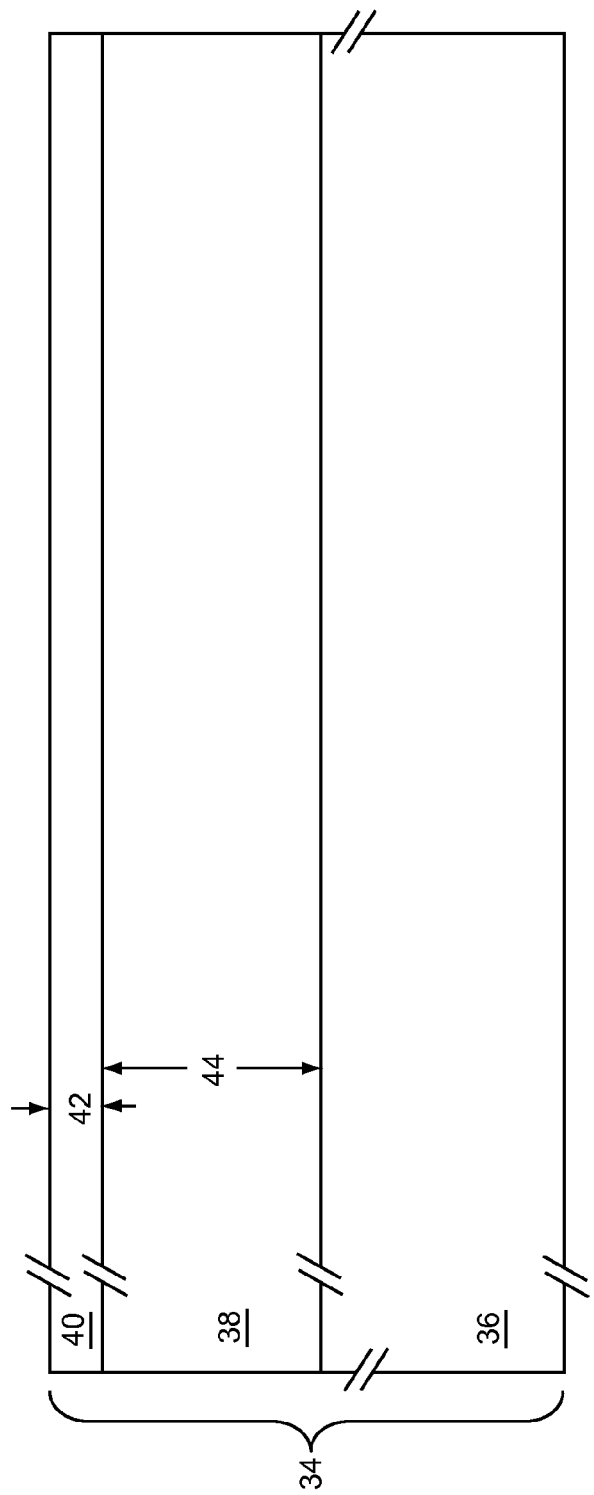
FIG. 3 shows a cross-section of a thin-film semiconductor die according to one embodiment of the thin-film semiconductor die.

FIG. 3 shows a cross-section of a thin-film semiconductor die 34, which may be a thin-film silicon-on-insulator (SOI) semiconductor die, according to one embodiment of the thin-film semiconductor die 34. The thin-film semiconductor die 34 includes a substrate 36, which may be an SOI substrate; an insulating layer 38, which may be an SOI insulating layer, over the substrate 36; and a thin-film semiconductor device layer 40, which may be a thin-film SOI device layer, over the insulating layer 38. The thin-film semiconductor device layer 40 has a semiconductor device layer thickness 42 and the insulating layer 38 has an insulating layer thickness 44. The substrate 36 may include silicon, sapphire, other semiconductor material, insulating material, or any combination thereof. The substrate 36 may be provided from a silicon handle wafer. The insulating layer 38 may include oxide, buried oxide, silicon dioxide, other insulating material, or any combination thereof. The thin-film semiconductor device layer 40 is a thin-film layer that includes silicon and is used to form electronic devices, such as transistor elements, diode elements, resistive elements, capacitive elements, or the like. The insulating layer 38 may be used to electrically isolate the thin-film semiconductor device layer 40 from the substrate 36.

In one embodiment of the thin-film semiconductor device layer 40, the thin-film semiconductor device layer 40 is partially-depleted SOI and not fully-depleted SOI. As the insulating layer thickness 44 increases, RF coupling to adjacent devices through the substrate 36 may be reduced, thereby improving isolation. Additionally, as resistivity of the substrate 36 increases, RF coupling to adjacent devices may be reduced, thereby improving RF performance of active RF devices and passive RF devices, such as inductors and transmission lines.

In a first exemplary embodiment of the substrate 36, the resistivity of the substrate 36 is greater than about 100 ohm-centimeters. In a second exemplary embodiment of the substrate 36, the resistivity of the substrate 36 is greater than about 500 ohm-centimeters. In a third exemplary embodiment of the substrate 36, the resistivity of the substrate 36 is greater than about 1000 ohm-centimeters. In one embodiment of the thin-film semiconductor die 34, the insulating layer thickness 44 is greater than the semiconductor device layer thickness 42. In a first exemplary embodiment of the thin-film semiconductor device layer 40, the semiconductor device layer thickness 42 is between about 100 nanometers and about 300 nanometers. In a second exemplary embodiment of the thin-film semiconductor device layer 40, the semiconductor device layer thickness 42 is less than or equal to about 600 nanometers. In a third exemplary embodiment of the thin-film semiconductor device layer 40, the semiconductor device layer thickness 42 is less than or equal to about 500 nanometers. In a fourth exemplary embodiment of the thin-film semiconductor device layer 40, the semiconductor device layer thickness 42 is less than or equal to about 400 nanometers. In a fifth exemplary embodiment of the thin-film semiconductor device layer 40, the semiconductor device layer thickness 42 is less than about 300 nanometers. In a sixth exemplary embodiment of the thin-film semiconductor device layer 40, the semiconductor device layer thickness 42 is less than about 200 nanometers. In a seventh exemplary embodiment of the thin-film semiconductor device layer 40, the semiconductor device layer thickness 42 is less than about 100 nanometers.

In a first exemplary embodiment of the insulating layer 38, the insulating layer thickness 44 is between about 200 nanometers and about 1000 nanometers. In a second exemplary embodiment of the insulating layer 38, the insulating layer thickness 44 is greater than about 200 nanometers. In a third exemplary embodiment of the insulating layer 38, the insulating layer thickness 44 is greater than about 600 nanometers. In a fourth exemplary embodiment of the insulating layer 38, the insulating layer thickness 44 is greater than about 1000 nanometers. In a fifth exemplary embodiment of the insulating layer 38, the insulating layer thickness 44 is greater than about 1500 nanometers. In a sixth exemplary embodiment of the insulating layer 38, the insulating layer thickness 44 is greater than about 2000 nanometers.

Figure 4:
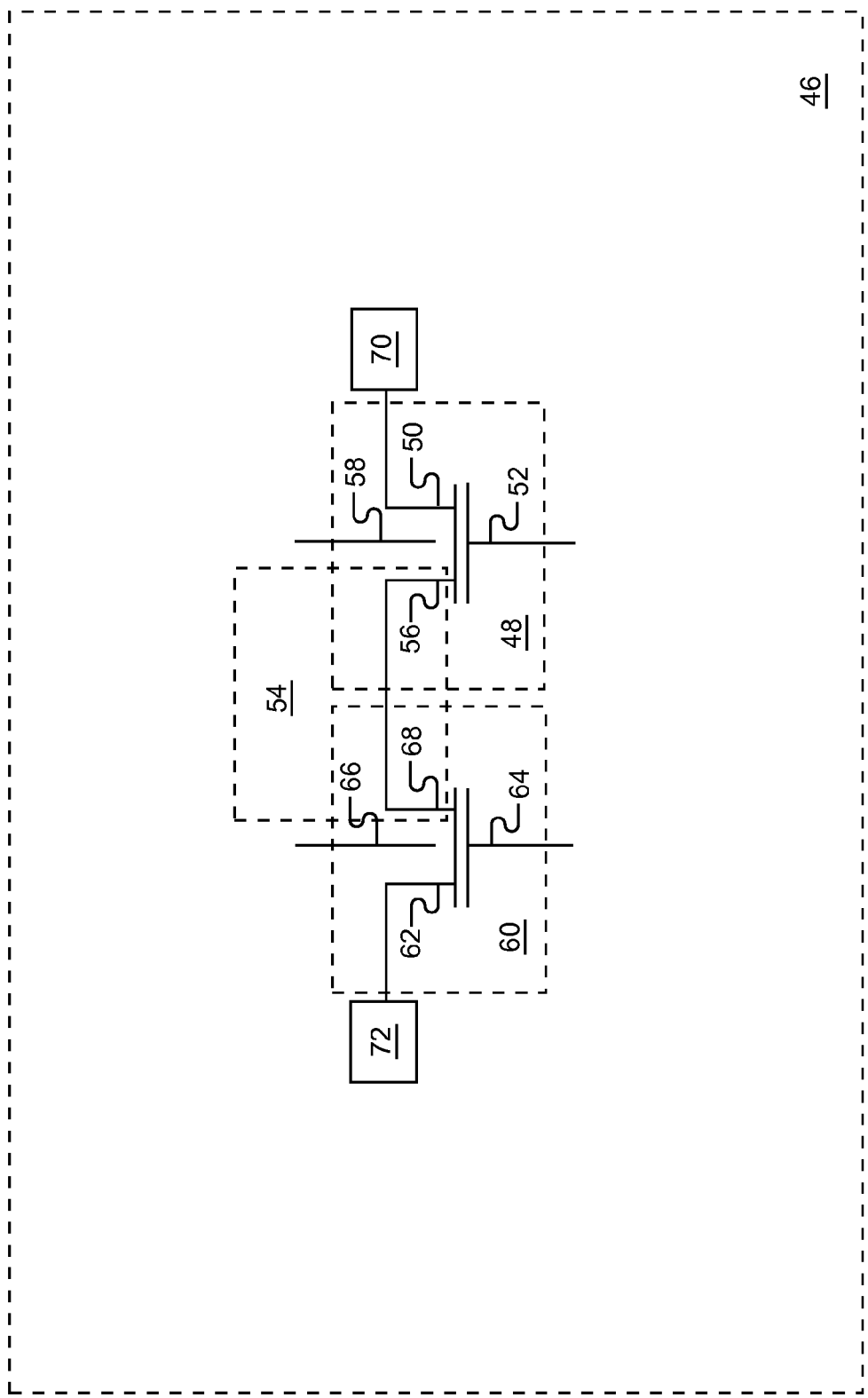
FIG. 4 shows details of a first stacked body-contacted FET, according to one embodiment of the first stacked body-contacted FET.

FIG. 4 shows details of a first stacked body-contacted FET 46, according to one embodiment of the first stacked body-contacted FET 46. The first stacked body-contacted FET 46 includes a first end FET 48, which includes a first drain 50, a first gate 52, a first merged source-drain 54, which functions as a first source 56 of the first end FET 48, and a first body 58. The first stacked body-contacted FET 46 further includes a second end FET 60, which includes a second source 62, a second gate 64, and a second body 66. The first merged source-drain 54 also functions as a second drain 68 of the second end FET 60. The first end FET 48 and the second end FET 60 are coupled in series between a first connection node 70 and a second connection node 72. Specifically, the first drain 50 is coupled to the first connection node 70 and the second source 62 is coupled to the second connection node 72. The first body 58 is not directly connected to the second body 66.

Figure 5:
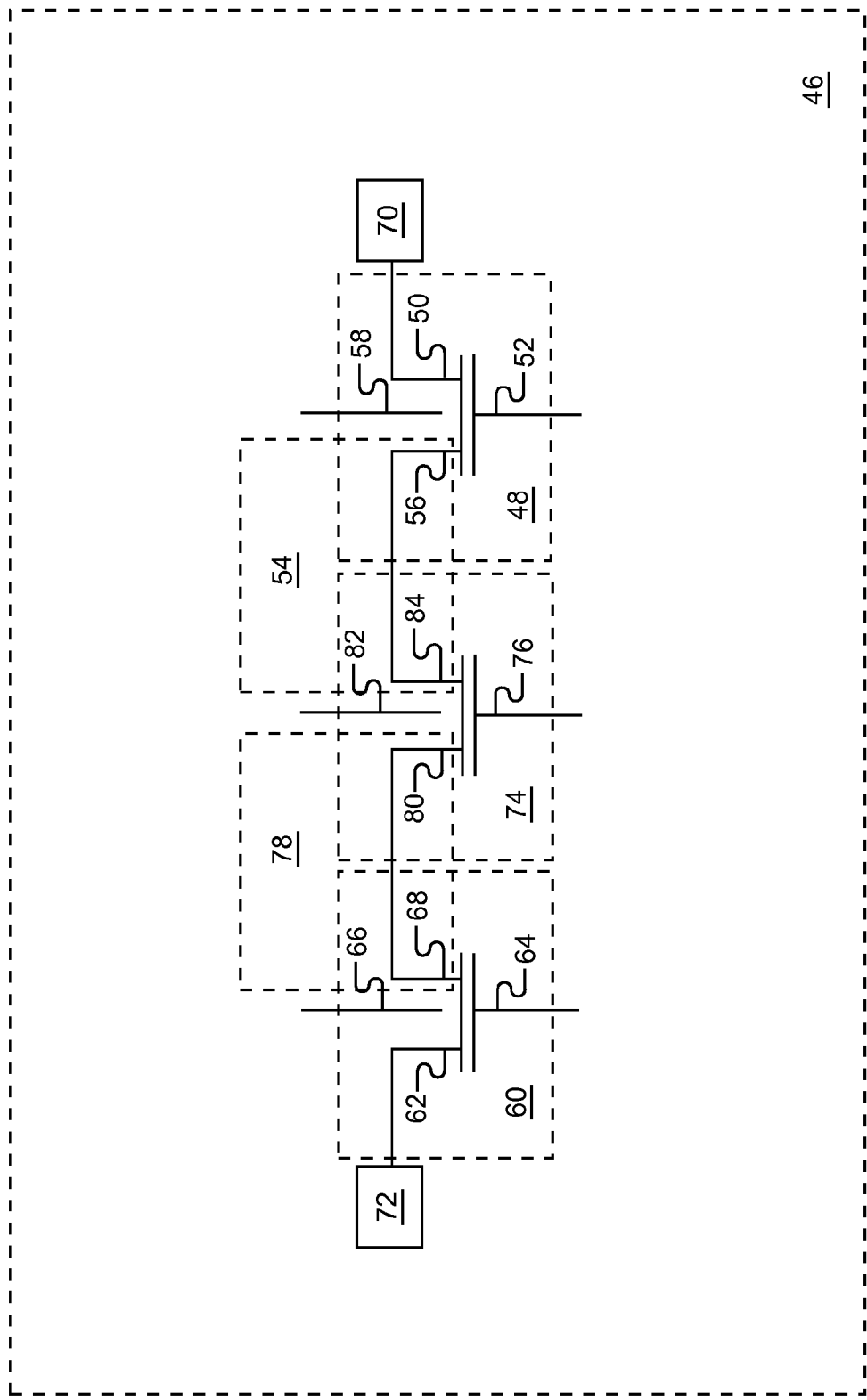
FIG. 5 shows details of the first stacked body-contacted FET, according to an alternate embodiment of the first stacked body-contacted FET.

FIG. 5 shows details of the first stacked body-contacted FET 46, according to an alternate embodiment of the first stacked body-contacted FET 46. The first stacked body-contacted FET 46 illustrated in FIG. 5 is similar to the first stacked body-contacted FET 46 illustrated in FIG. 4, except the first stacked body-contacted FET 46 illustrated in FIG. 5 further includes a first inner FET 74 coupled between the first end FET 48 and the second end FET 60. As such, the first end FET 48, the first inner FET 74, and the second end FET 60 are coupled in series between the first connection node 70 and the second connection node 72.

The first inner FET 74 includes a first inner gate 76, a first inner merged source-drain 78, which functions as a first inner source 80 of the first inner FET 74, and a first inner body 82. Instead of functioning as the second drain 68 as illustrated in FIG. 4, the first merged source-drain 54 functions as a first inner drain 84 of the first inner FET 74. The first inner merged source-drain 78 further functions as the second drain 68. The first inner body 82 is not directly connected to either the first body 58 or the second body 66.

Figure 6:
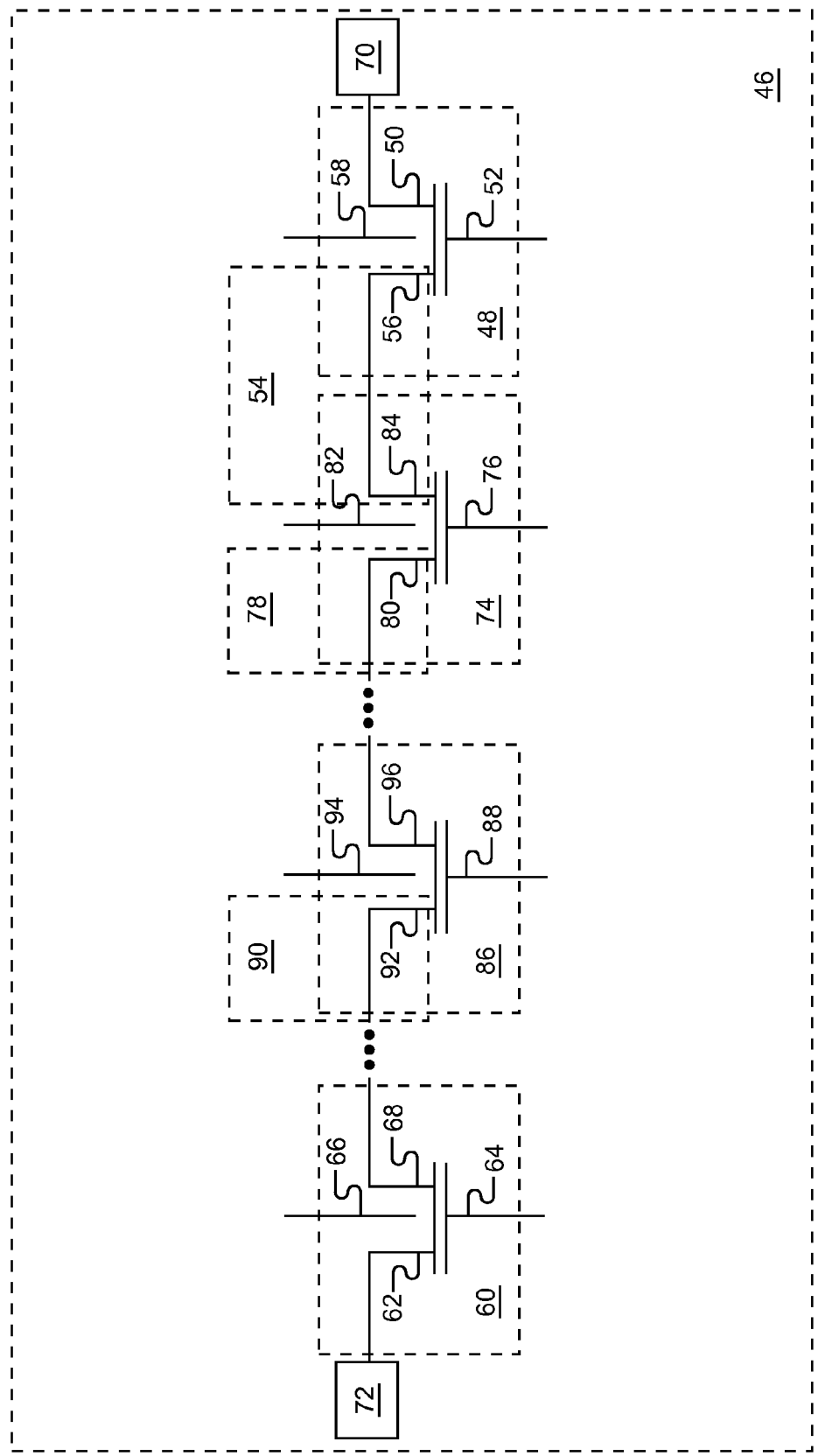
FIG. 6 shows details of the first stacked body-contacted FET, according to an additional embodiment of the first stacked body-contacted FET.

FIG. 6 shows details of the first stacked body-contacted FET 46, according to an additional embodiment of the first stacked body-contacted FET 46. The first stacked body-contacted FET 46 illustrated in FIG. 6 is similar to the first stacked body-contacted FET 46 illustrated in FIG. 5, except the first stacked body-contacted FET 46 illustrated in FIG. 6 further includes up to and including an $M^{TH}$ FET 86 coupled between the second end FET 60 and the first inner FET 74. As such, the first end FET 48, the first inner FET 74, the $M^{TH}$ FET 86, the second end FET 60, and any additional FETs (not shown) up to the $M^{TH}$ FET 86 are coupled in series between the first connection node 70 and the second connection node 72.

The $M^{TH}$ FET 86 includes an $M^{TH}$ gate 88, an $M^{TH}$ merged source-drain 90, which functions as an $M^{TH}$ source 92 of the $M^{TH}$ FET 86, and an $M^{TH}$ body 94. The first inner merged source-drain 78 or another inner merged source-drain (not shown) of an additional FET (not shown) functions as an M$^{TH}$ drain 96 of the M$^{TH}$ FET 86. Further, the M$^{TH}$ merged source-drain 90 functions as the second drain 68 or as another drain (not shown) of an additional FET (not shown). The M$^{TH}$ body 94 is not directly connected to the first inner body 82, to the first body 58, or to the second body 66. In general, each of the bodies 58, 66, 82, 94 is not directly connected to any of the bodies 58, 66, 82, 94 of any other of the FETs 48, 60, 74, 86.

Figure 7:
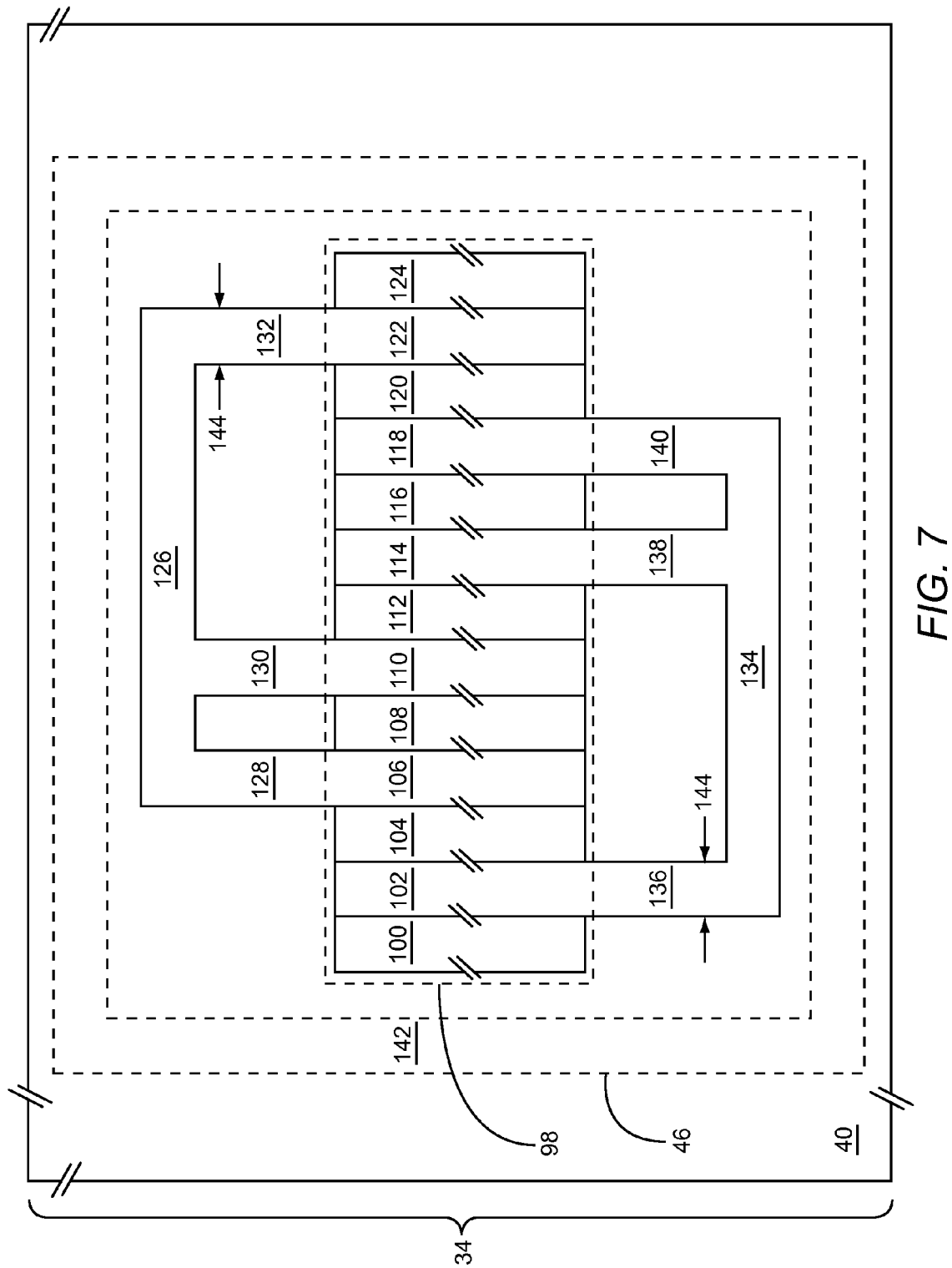
FIG. 7 shows a top view of the first stacked body-contacted FET formed using the thin-film semiconductor die illustrated in FIG. 3 according to one embodiment of the first stacked body-contacted FET.

FIG. 7 shows a top view of the first stacked body-contacted FET 46 illustrated in FIG. 4 formed using the thin-film semiconductor die 34 illustrated in FIG. 3 according to one embodiment of the first stacked body-contacted FET 46. FIG. 7 shows details of the first drain 50 and the first body 58 of the first end FET 48, of the second source 62 and the second body 66 of the second end FET 60, and of the first merged source-drain 54 of both the first end FET 48 and the second end FET 60. The first stacked body-contacted FET 46 includes an active area 98, which is formed in the thin-film semiconductor device layer 40. The active area 98 includes a first finger 100 of the second source 62, a first finger 102 of the second body 66, a first finger 104 of the first merged source-drain 54, a first finger 106 of the first body 58, a first finger 108 of the first drain 50, a second finger 110 of the first body 58, a second finger 112 of the first merged source-drain 54, a second finger 114 of the second body 66, a second finger 116 of the second source 62, a third finger 118 of the second body 66, a third finger 120 of the first merged source-drain 54, a third finger 122 of the first body 58, and a second finger 124 of the first drain 50.

The first finger 100 of the second source 62 is adjacent to the first finger 102 of the second body 66, which is adjacent to the first finger 104 of the first merged source-drain 54, which is adjacent to the first finger 106 of the first body 58, which is adjacent to the first finger 108 of the first drain 50, which is adjacent to the second finger 110 of the first body 58, which is adjacent to the second finger 112 of the first merged source-drain 54, which is adjacent to the second finger 114 of the second body 66, which is adjacent to the second finger 116 of the second source 62, which is adjacent to the third finger 118 of the second body 66, which is adjacent to the third finger 120 of the first merged source-drain 54, which is adjacent to the third finger 122 of the first body 58, which is adjacent to the second finger 124 of the first drain 50.

The first stacked body-contacted FET 46 further includes formed in the thin-film semiconductor device layer 40 a first body finger interconnect region 126 outside of the active area 98 on one side of the active area 98, a first finger extension 128 of the first body 58 between and electrically connecting the first finger 106 of the first body 58 to the first body finger interconnect region 126, a second finger extension 130 of the first body 58 between and electrically connecting the second finger 110 of the first body 58 to the first body finger interconnect region 126, and a third finger extension 132 of the first body 58 between and electrically connecting the third finger 122 of the first body 58 to the first body finger interconnect region 126.

The first stacked body-contacted FET 46 further includes formed in the thin-film semiconductor device layer 40 a second body finger interconnect region 134 outside of the active area 98 on an opposite side of the active area 98, a first finger extension 136 of the second body 66 between and electrically connecting the first finger 102 of the second body 66 to the second body finger interconnect region 134, a second finger extension 138 of the second body 66 between and electrically connecting the second finger 114 of the second body 66 to the second body finger interconnect region 134, and a third finger extension 140 of the second body 66, between and electrically connecting the third finger 118 of the second body 66 to the second body finger interconnect region 134.

A lateral isolation band 142 encircles a periphery of the first end FET 48 and the second end FET 60. In general, the lateral isolation band 142 encircles a periphery of the FETs 48, 60, 74, 86. The lateral isolation band 142 laterally isolates the FETs 48, 60, 74, 86 from other devices (not shown) in the thin-film semiconductor die 34 (FIG. 3). The first finger extension 128 of the first body 58, the second finger extension 130 of the first body 58, the third finger extension 132 of the first body 58, the first finger extension 136 of the second body 66, the second finger extension 138 of the second body 66, and the third finger extension 140 of the second body 66 each have a body finger extension width 144.

In one embodiment of the thin-film semiconductor device layer 40, the thin-film semiconductor device layer 40 includes a pwell, which provides the first finger 102 of the second body 66, the first finger 106 of the first body 58, the second finger 110 of the first body 58, the second finger 114 of the second body 66, the third finger 118 of the second body 66, the third finger 122 of the first body 58, the first body finger interconnect region 126, the first finger extension 128 of the first body 58, the second finger extension 130 of the first body 58, the third finger extension 132 of the first body 58, the second body finger interconnect region 134, the first finger extension 136 of the second body 66, the second finger extension 138 of the second body 66, and the third finger extension 140 of the second body 66.

In an alternate embodiment of the thin-film semiconductor device layer 40, the thin-film semiconductor device layer 40 includes an nwell, which provides the first finger 102 of the second body 66, the first finger 106 of the first body 58, the second finger 110 of the first body 58, the second finger 114 of the second body 66, the third finger 118 of the second body 66, the third finger 122 of the first body 58, the first body finger interconnect region 126, the first finger extension 128 of the first body 58, the second finger extension 130 of the first body 58, the third finger extension 132 of the first body 58, the second body finger interconnect region 134, the first finger extension 136 of the second body 66, the second finger extension 138 of the second body 66, and the third finger extension 140 of the second body 66.

In one embodiment of the thin-film semiconductor device layer 40, the thin-film semiconductor device layer 40 includes an N+ implant, which provides the first finger 100 of the second source 62, the first finger 104 of the first merged source-drain 54, the first finger 108 of the first drain 50, the second finger 112 of the first merged source-drain 54, the second finger 116 of the second source 62, the third finger 120 of the first merged source-drain 54, and the second finger 124 of the first drain 50. In one embodiment of the thin-film semiconductor device layer 40, the N+ implant extends through the thin-film semiconductor device layer 40 to the insulating layer 38 (FIG. 3). The thin-film semiconductor device layer 40 may be an SOI thin-film semiconductor device layer 40 and the SOI thin-film semiconductor device layer 40 may be fully-depleted SOI.

In an alternate embodiment of the thin-film semiconductor device layer 40, the thin-film semiconductor device layer 40 includes a P+ implant, which provides the first finger 100 of the second source 62, the first finger 104 of the first merged source-drain 54, the first finger 108 of the first drain 50, the second finger 112 of the first merged source-drain 54, the second finger 116 of the second source 62, the third finger 120 of the first merged source-drain 54, and the second finger 124 of the first drain 50. In an alternate embodiment of the thin-film semiconductor device layer 40, the P+ implant extends through the thin-film semiconductor device layer 40 to the insulating layer 38 (FIG. 3).

Figure 8:
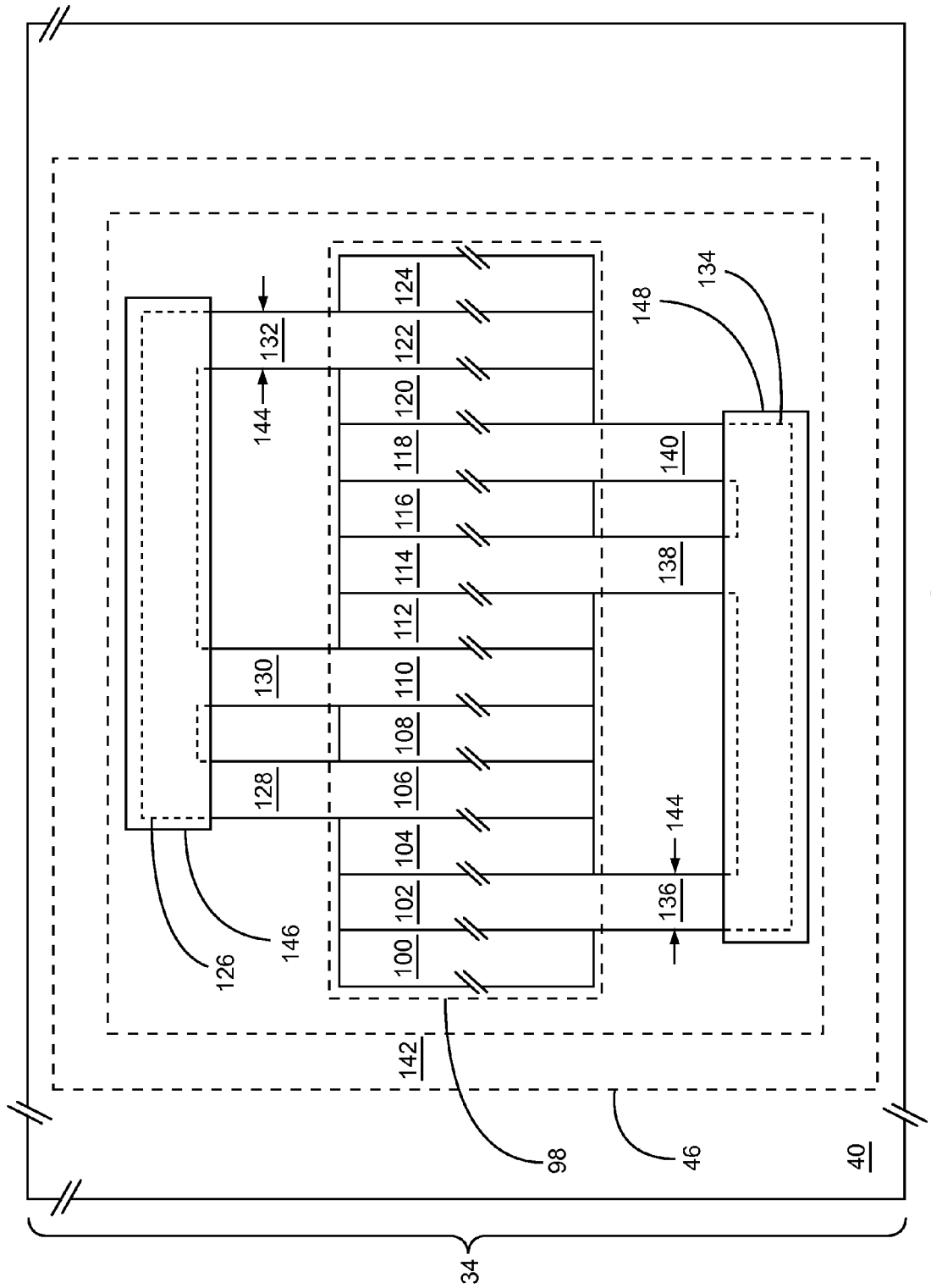
FIG. 8 shows additional details of the first stacked body-contacted FET illustrated in FIG. 7 according to an alternate embodiment of the first stacked body-contacted FET.

FIG. 8 shows additional details of the first stacked body-contacted FET 46 illustrated in FIG. 7 according to an alternate embodiment of the first stacked body-contacted FET 46. The first stacked body-contacted FET 46 illustrated in FIG. 8 is similar to the first stacked body-contacted FET 46 illustrated in FIG. 7, except the first stacked body-contacted FET 46 illustrated in FIG. 8 further includes a first body contact region 146 over the first body finger interconnect region 126 and a second body contact region 148 over the second body finger interconnect region 134. In general, the first body contact region 146 is adjacent and electrically connected to the first body finger interconnect region 126 and is outside the active area 98. The second body contact region 148 is adjacent and electrically connected to the second body finger interconnect region 134 and is outside the active area 98.

In one embodiment of the first body contact region 146 and the second body contact region 148, a P+ implant provides the first body contact region 146 and the second body contact region 148 and a pwell provides the first body finger interconnect region 126 and the second body finger interconnect region 134. The first body contact region 146 and the second body contact region 148 may contain no implants that would impede an electrical connection between the P+ implant and the pwell. In an alternate embodiment of the first body contact region 146 and the second body contact region 148, an N+ implant provides the first body contact region 146 and the second body contact region 148 and an nwell provides the first body finger interconnect region 126 and the second body finger interconnect region 134. The first body contact region 146 and the second body contact region 148 may contain no implants that would impede an electrical connection between the N+ implant and the nwell.

Figure 9:
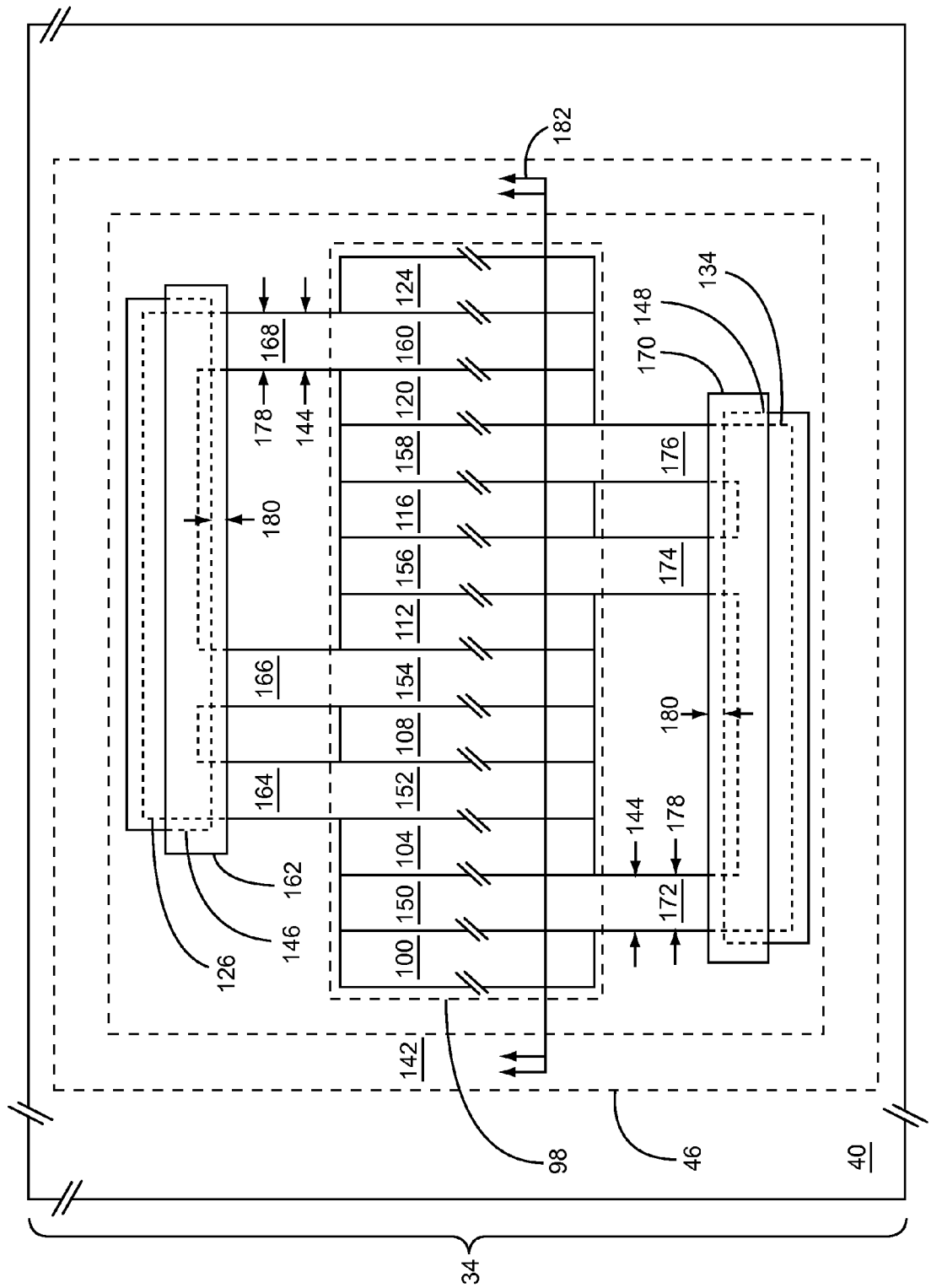
FIG. 9 shows additional details of the first stacked body-contacted FET illustrated in FIG. 8 according to additional embodiment of the first stacked body-contacted FET.

FIG. 9 shows additional details of the first stacked body-contacted FET 46 illustrated in FIG. 8 according to additional embodiment of the first stacked body-contacted FET 46. The first stacked body-contacted FET 46 illustrated in FIG. 9 is similar to the first stacked body-contacted FET 46 illustrated in FIG. 8, except the first stacked body-contacted FET 46 illustrated in FIG. 9 further includes the first gate 52 of the first end FET 48 and the second gate 64 of the second end FET 60. Specifically, the first stacked body-contacted FET 46 includes a first finger 150 of the second gate 64 over the first finger 102 of the second body 66, a first finger 152 of the first gate 52 over the first finger 106 of the first body 58, a second finger 154 of the first gate 52 over the second finger 110 of the first body 58, a second finger 156 of the second gate 64 over the second finger 114 of the second body 66, a third finger 158 of the second gate 64 over the third finger 118 of the second body 66, and a third finger 160 of the first gate 52 over the third finger 122 of the first body 58.

The first stacked body-contacted FET 46 further includes a first gate finger interconnect region 162 over at least a portion of the first body contact region 146 outside of the active area 98 on one side of the active area 98, a first finger extension 164 of the first gate 52 over the first finger extension 128 of the first body 58 and between and electrically connecting the first finger 152 of the first gate 52 to the first gate finger interconnect region 162, a second finger extension 166 of the first gate 52 over the second finger extension 130 of the first body 58 and between and electrically connecting the second finger 154 of the first gate 52 to the first gate finger interconnect region 162, and a third finger extension 168 of the first gate 52 over the third finger extension 132 of the first body 58 and between and electrically connecting the third finger 160 of the first gate 52 to the first gate finger interconnect region 162.

The first stacked body-contacted FET 46 further includes a second gate finger interconnect region 170 over at least a portion of the second body contact region 148 outside of the active area 98 on an opposite side of the active area 98, a first finger extension 172 of the second gate 64 over the first finger extension 136 of the second body 66 and between and electrically connecting the first finger 150 of the second gate 64 to the second gate finger interconnect region 170, a second finger extension 174 of the second gate 64 over the second finger extension 138 of the second body 66 and between and electrically connecting the second finger 156 of the second gate 64 to the second gate finger interconnect region 170, and a third finger extension 176 of the second gate 64 over the third finger extension 140 of the second body 66 and between and electrically connecting the third finger 158 of the second gate 64 to the second gate finger interconnect region 170.

The first finger extension 164 of the first gate 52, the second finger extension 166 of the first gate 52, the third finger extension 168 of the first gate 52, the first finger extension 172 of the second gate 64, the second finger extension 174 of the second gate 64, and the third finger extension 176 of the second gate 64 each has a gate finger extension width 178. In the first stacked body-contacted FET 46 illustrated in FIG. 9, the gate finger extension width 178 is about equal to the body finger extension width 144.

The first body contact region 146 and the first gate finger interconnect region 162 may have a body contact region to gate finger interconnect region overlap 180, such that at least a portion of the first gate finger interconnect region 162 is between the first body contact region 146 and the active area 98. Similarly, the second body contact region 148 and the second gate finger interconnect region 170 may have the body contact region to gate finger interconnect region overlap 180, such that at least a portion of the second gate finger interconnect region 170 is between the second body contact region 148 and the active area. The body contact region to gate finger interconnect region overlap 180 may help prevent degradation of breakdown voltages of the first stacked body-contacted FET 46 between the sources and drains 50, 56, 62, 68 via the body contact regions 146, 148. Further, the body contact region to gate finger interconnect region overlap 180 may help prevent problems due to misalignment issues.

In one embodiment of the first stacked body-contacted FET 46, polysilicon provides the first finger 150 of the second gate 64, the first finger 152 of the first gate 52, the second finger 154 of the first gate 52, the second finger 156 of the second gate 64, the third finger 158 of the second gate 64, the third finger 160 of the first gate 52, the first gate finger interconnect region 162, the first finger extension 164 of the first gate 52, the second finger extension 166 of the first gate 52, the third finger extension 168 of the first gate 52, the second gate finger interconnect region 170, the first finger extension 172 of the second gate 64, the second finger extension 174 of the second gate 64, and the third finger extension 176 of the second gate 64. The first stacked body-contacted FET 46 illustrated in FIG. 9 has an active area cross-section 182 of the active area 98.

Figure 10:
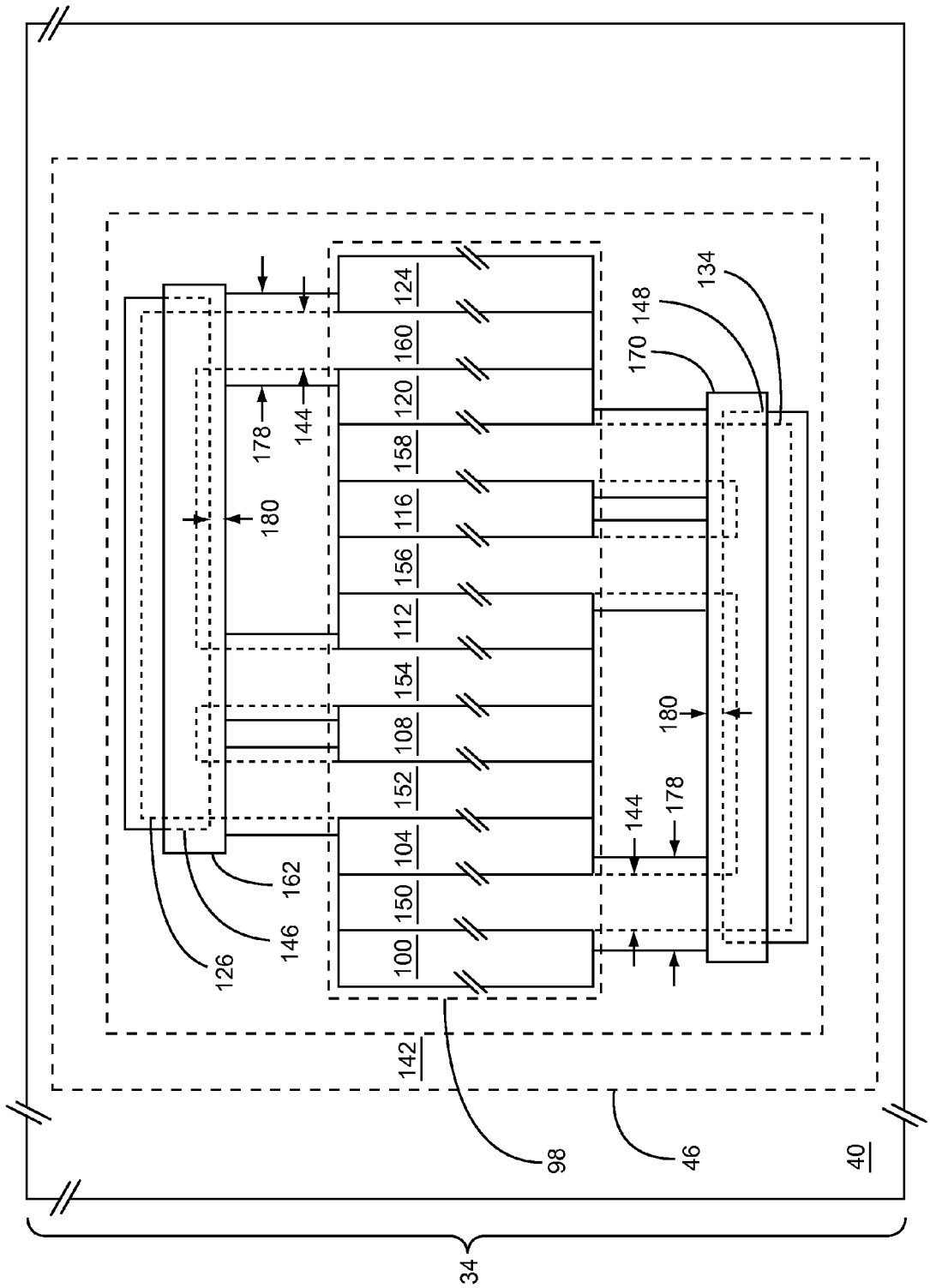
FIG. 10 shows additional details of the first stacked body-contacted FET illustrated in FIG. 9 according to another embodiment of the first stacked body-contacted FET.

FIG. 10 shows additional details of the first stacked body-contacted FET 46 illustrated in FIG. 9 according to another embodiment of the first stacked body-contacted FET 46. The first stacked body-contacted FET 46 illustrated in FIG. 10 is similar to the first stacked body-contacted FET 46 illustrated in FIG. 9, except in the first stacked body-contacted FET 46 illustrated in FIG. 10 the body finger extension width 144 is less than the gate finger extension width 178.

Figure 11:
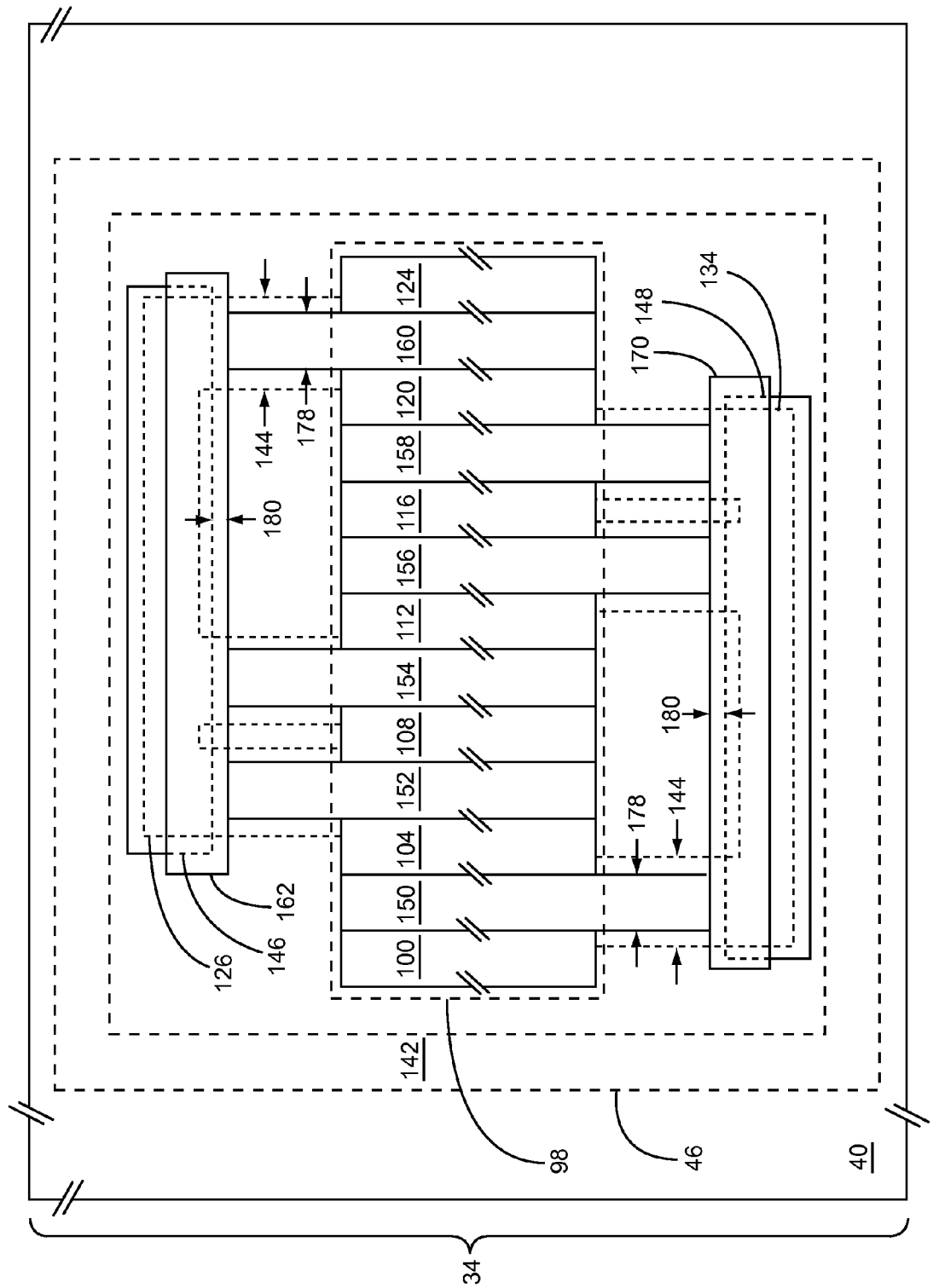
FIG. 11 shows additional details of the first stacked body-contacted FET illustrated in Figure according to a supplemental embodiment of the first stacked body-contacted FET.

FIG. 11 shows additional details of the first stacked body-contacted FET 46 illustrated in FIG. 10 according to a supplemental embodiment of the first stacked body-contacted FET 46. The first stacked body-contacted FET 46 illustrated in FIG. 11 is similar to the first stacked body-contacted FET 46 illustrated in FIG. 10, except in the first stacked body-contacted FET 46 illustrated in FIG. 11 the body finger extension width 144 is greater than the gate finger extension width 178.

Figure 12:
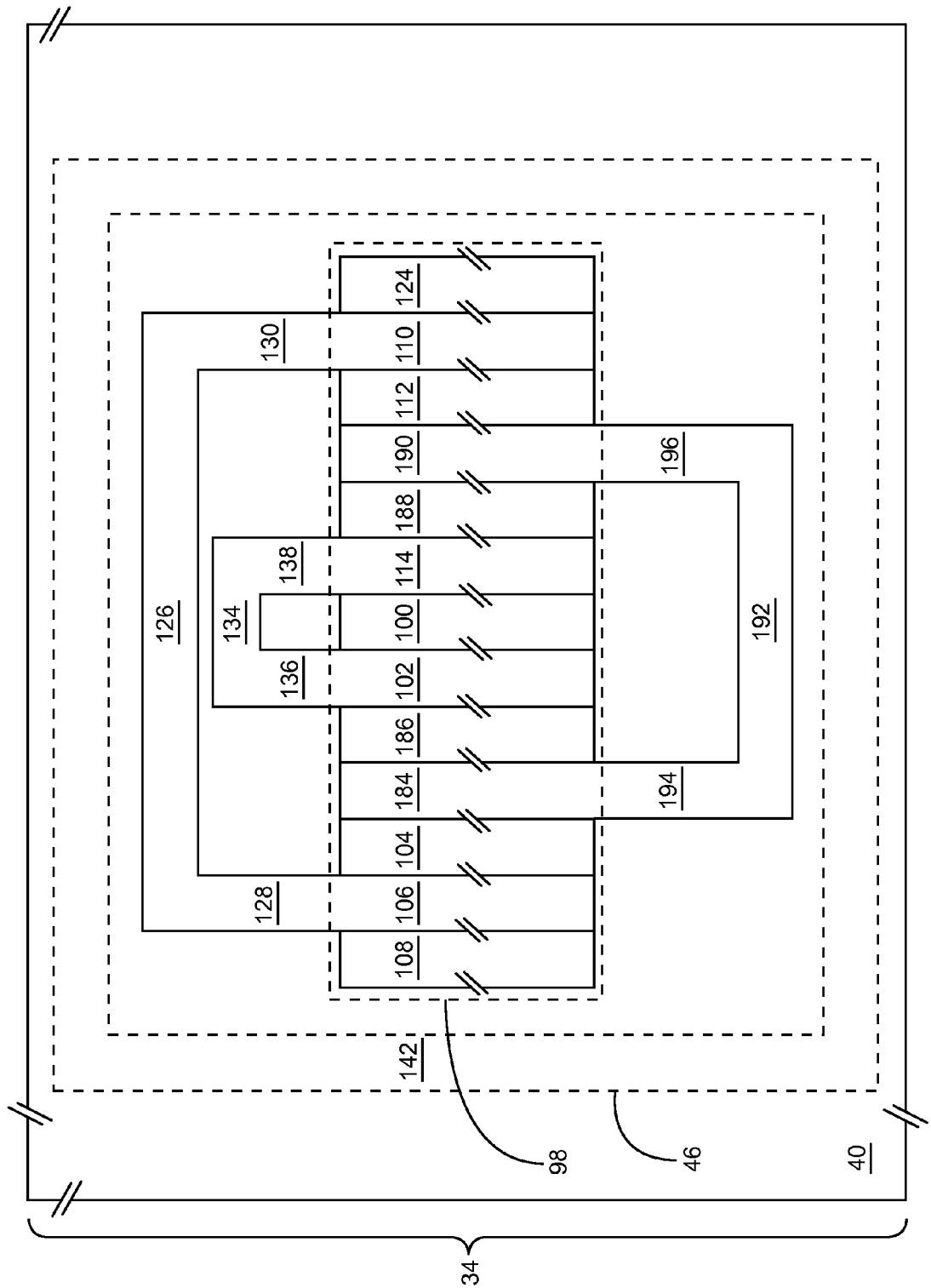
FIG. 12 shows a top view of the first stacked body-contacted FET illustrated in FIG. 5 formed using a thin-film semiconductor die illustrated in FIG. 3 according to an alternate embodiment of the first stacked body-contacted FET.

FIG. 12 shows a top view of the first stacked body-contacted FET 46 illustrated in FIG. 5 formed using the thin-film semiconductor die 34 illustrated in FIG. 3 according to an alternate embodiment of the first stacked body-contacted FET 46. FIG. 12 shows details of the first drain 50 and the first body 58 of the first end FET 48, of the second source 62 and the second body 66 of the second end FET 60, of the first inner body 82 of the first inner FET 74, of the first merged source-drain 54 of both the first end FET 48 and the first inner FET 74, and of the first inner merged source-drain 78 of the first inner FET 74 and the second end FET 60. The first stacked body-contacted FET 46 includes the active area 98, which is formed in the thin-film semiconductor device layer 40.

The active area 98 includes the first finger 108 of the first drain 50, the first finger 106 of the first body 58, the first finger 104 of the first merged source-drain 54, a first finger 184 of the first inner body 82, a first finger 186 of the first inner merged source-drain 78, the first finger 102 of the second body 66, the first finger 100 of the second source 62, the second finger 114 of the second body 66, a second finger 188 of the first inner merged source-drain 78, a second finger 190 of the first inner body 82, the second finger 112 of the first merged source-drain 54, the second finger 110 of the first body 58, and the second finger 124 of the first drain 50.

The first finger 108 of the first drain 50 is adjacent to the first finger 106 of the first body 58, which is adjacent to the first finger 104 of the first merged source-drain 54, which is adjacent to the first finger 184 of the first inner body 82, which is adjacent to the first finger 186 of the first inner merged source-drain 78, which is adjacent to the first finger 102 of the second body 66, which is adjacent to the first finger 100 of the second source 62, which is adjacent to the second finger 114 of the second body 66, which is adjacent to the second finger 188 of the first inner merged source-drain 78, which is adjacent to the second finger 190 of the first inner body 82, which is adjacent to the second finger 112 of the first merged source-drain 54, which is adjacent to the second finger 110 of the first body 58, which is adjacent to the second finger 124 of the first drain 50.

The first stacked body-contacted FET 46 further includes formed in the thin-film semiconductor device layer 40 a first body finger interconnect region 126 outside of the active area 98 on one side of the active area 98, the first finger extension 128 of the first body 58 between and electrically connecting the first finger 106 of the first body 58 to the first body finger interconnect region 126 and a second finger extension 130 of the first body 58 between and electrically connecting the second finger 110 of the first body 58 to the first body finger interconnect region 126.

The first stacked body-contacted FET 46 further includes formed in the thin-film semiconductor device layer 40 a second body finger interconnect region 134 between the active area 98 and the first body finger interconnect region 126, the first finger extension 136 of the second body 66 between and electrically connecting the first finger 102 of the second body 66 to the second body finger interconnect region 134 and a second finger extension 138 of the second body 66 between and electrically connecting the second finger 114 of the second body 66 to the second body finger interconnect region 134.

The first stacked body-contacted FET 46 further includes formed in the thin-film semiconductor device layer 40 first inner body finger interconnect region 192 outside of the active area 98 on an opposite side of the active area 98, a first finger extension 194 of the first inner body 82 between and electrically connecting the first finger 184 of the first inner body 82 to the first inner body finger interconnect region 192 and a second finger extension 196 of the first inner body 82 between and electrically connecting the second finger 190 of the first inner body 82 to the first inner body finger interconnect region 192.

By using the technique of an interconnect region between another interconnect region and the active area 98, any number of FETs may be coupled in series having any number of fingers. Further, multiple interconnect regions may be nested inside one another to provide further flexibility in layout.

Figure 13:
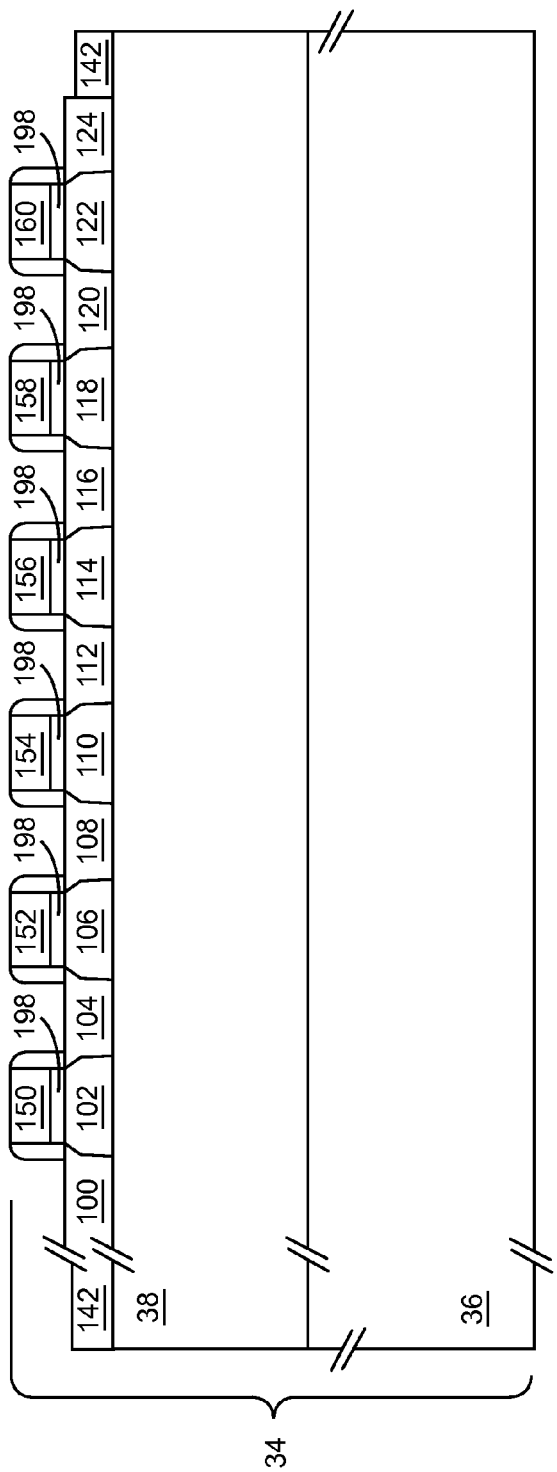
FIG. 13 shows an active area cross-section illustrated in FIG. 8 according to one embodiment of the active area cross-section.

FIG. 13 shows the active area cross-section 182 illustrated in FIG. 8 according to one embodiment of the active area cross-section 182. The active area cross-section 182 includes the first finger 100 of the second source 62, the first finger 102 of the second body 66, the first finger 104 of the first merged source-drain 54, the first finger 106 of the first body 58, the first finger 108 of the first drain 50, the second finger 110 of the first body 58, the second finger 112 of the first merged source-drain 54, the second finger 114 of the second body 66, the second finger 116 of the second source 62, the third finger 118 of the second body 66, the third finger 120 of the first merged source-drain 54, the third finger 122 of the first body 58, and the second finger 124 of the first drain 50.

Gate oxide 198 is over the first finger 102 of the second body 66, the first finger 106 of the first body 58, the second finger 110 of the first body 58, the second finger 114 of the second body 66, the third finger 118 of the second body 66, and the third finger 122 of the first body 58. The first finger 150 of the second gate 64, the first finger 152 of the first gate 52, the second finger 154 of the first gate 52, the second finger 156 of the second gate 64, the third finger 158 of the second gate 64, and the third finger 160 of the first gate 52 are over the gate oxide 198.

Figure 14:
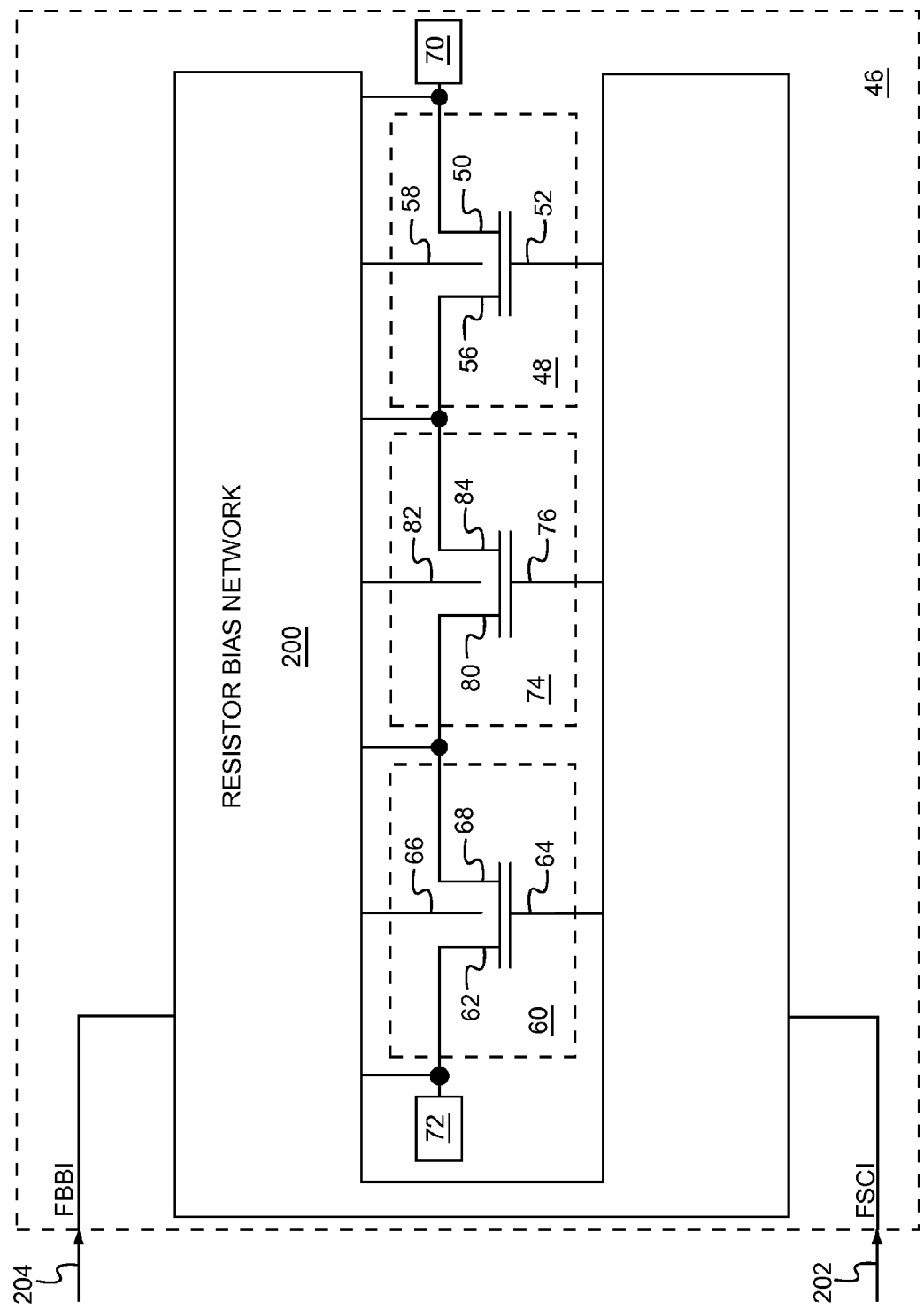
FIG. 14 is a schematic diagram showing the first stacked body-contacted FET illustrated in FIG. 5 according to one embodiment of the first stacked body-contacted FET 46.

FIG. 14 is a schematic diagram showing the first stacked body-contacted FET 46 illustrated in FIG. 5 according to one embodiment of the first stacked body-contacted FET 46. The first stacked body-contacted FET 46 includes the first end FET 48, the first inner FET 74, the second end FET 60, the second connection node 72, the first connection node 70, a first body bias input FBBI, a first switch control input FSCI, and a resistor bias network 200. During operation of the first stacked body-contacted FET 46, the first switch control input FSCI may receive a first switch control signal 202 and the first body bias input FBBI may receive a first body bias control signal 204. The first end FET 48, the first inner FET 74, and the second end FET 60 are coupled in series between the second connection node 72 and the first connection node 70, such that the second source 62 is coupled to the second connection node 72, the second drain 68 is coupled to the first inner source 80, the first inner drain 84 is coupled to the first source 56, and the first drain 50 is coupled to the first connection node 70.

The resistor bias network 200 is coupled to the first source 56, the first body 58, the first drain 50, the first gate 52, the first inner source 80, the first inner body 82, the first inner drain 84, the first inner gate 76, the second source 62, the second body 66, the second drain 68, the second gate 64, the first body bias input FBBI, and the first switch control input FSCI. During operation of the first stacked body-contacted FET 46, the resistor bias network 200 may provide appropriate bias behavior to the first source 56, the first body 58, the first drain 50, the first gate 52, the first inner source 80, the first inner body 82, the first inner drain 84, the first inner gate 76, the second source 62, the second body 66, the second drain 68, and the second gate 64 based on the first switch control signal 202, the first body bias control signal 204, signals between the second connection node 72 and the first connection node 70, or any combination thereof.

Figure 15:
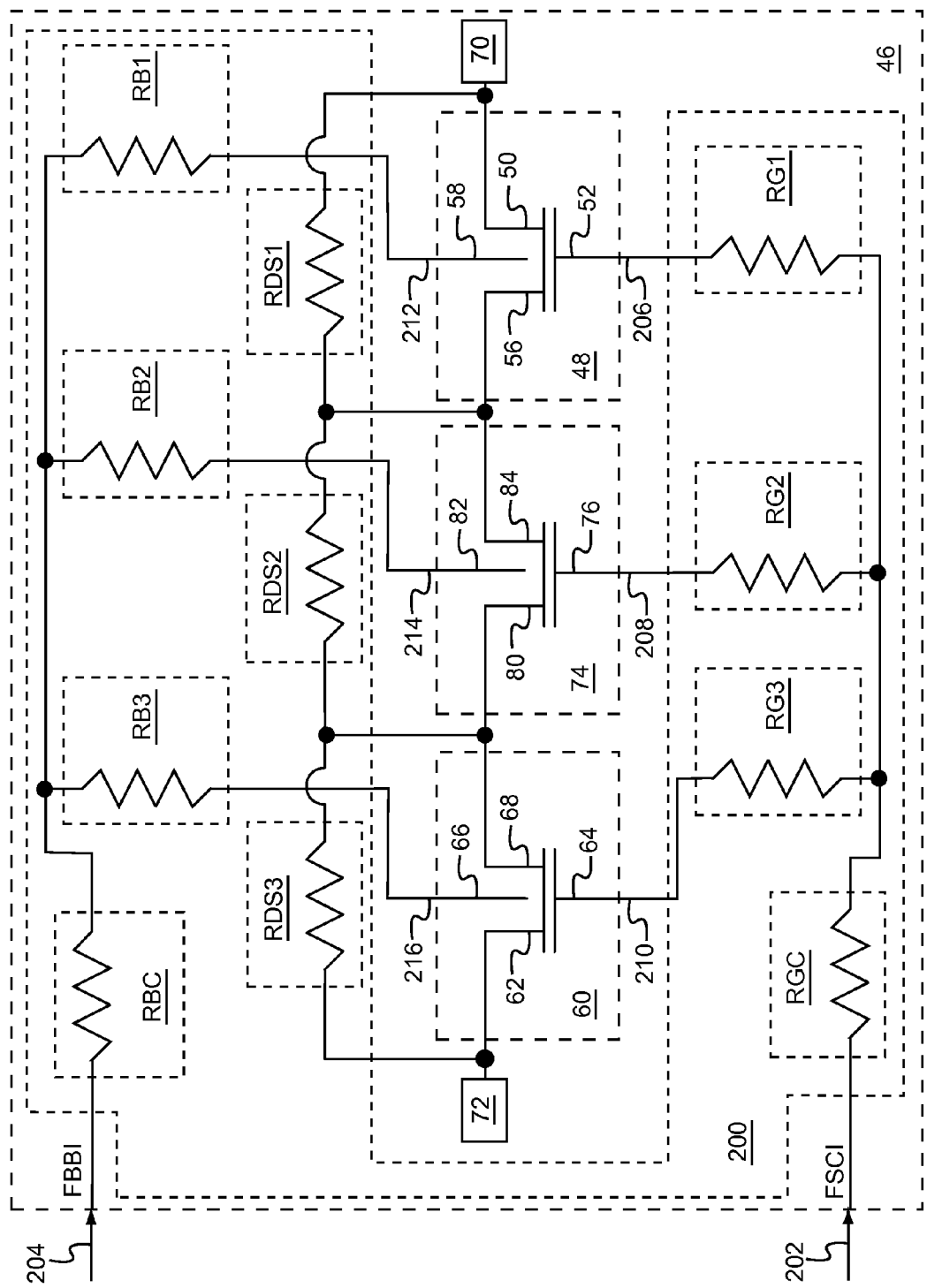
FIG. 15 is a schematic diagram showing details of a resistor bias network illustrated in FIG. 14 according to one embodiment of the resistor bias network.

FIG. 15 is a schematic diagram showing details of the resistor bias network 200 illustrated in FIG. 14 according to one embodiment of the resistor bias network 200. The resistor bias network 200 includes a first body bias resistive element RB1, a second body bias resistive element RB2, a third body bias resistive element RB3, a common body bias resistive element RBC, a first gate resistive element RG1, a second gate resistive element RG2, a third gate resistive element RG3, a common gate resistive element RGC, a first drain-to-source resistive element RDS1, a second drain-to-source resistive element RDS2, and a third drain-to-source resistive element RDS3.

The first gate resistive element RG1 is coupled between the first gate 52 and a gate node (not shown) to provide a first gate signal 206 to the first gate 52. The second gate resistive element RG2 is coupled between the first inner gate 76 and the gate node to provide a second gate signal 208 to the first inner gate 76. The third gate resistive element RG3 is coupled between the second gate 64 and the gate node to provide a third gate signal 210 to the second gate 64. The common gate resistive element RGC is coupled between the gate node and the first switch control input FSCI. During operation of the first stacked body-contacted FET 46, the first switch control input FSCI may receive the first switch control signal 202, such that the first, the second, and the third gate signals 206, 208, 210 are based on the first switch control signal 202. The first switch control signal 202 is used to select either the ON state or the OFF state of the first stacked body-contacted FET 46. Selection between the ON state and the OFF state normally occurs at a much lower frequency than the frequency of RF signals between the first and the second connection nodes 70, 72. As such, the first switch control signal 202 may have direct current (DC)-like influences on the first stacked body-contacted FET 46. To minimize the impact of such DC influences, the first, the second, and the third gate resistive elements RG1, RG2, RG3 may have large values of resistance to isolate the first, the first inner, and the second gates 52, 76, 64 from one another. Normally, the first stacked body-contacted FET 46 will have one of the ON state, the OFF state, or a non-operating state.

The first body bias resistive element RB1 is coupled between the first body 58 and a body bias node (not shown) to provide a first body bias signal 212 to the first body 58. The second body bias resistive element RB2 is coupled between the first inner body 82 and the body bias node to provide a second body bias signal 214 to the first inner body 82. The third body bias resistive element RB3 is coupled between the second body 66 and the body bias node to provide a third body bias signal 216 to the second body 66. The common body bias resistive element RBC is coupled between the body bias node and the first body bias input FBBI. During operation of the first stacked body-contacted FET 46, the first body bias input FBBI may receive the first body bias control signal 204, such that the first, the second, and the third body bias signals 212, 214, 216 are based on the first body bias control signal 204. The first body bias control signal 204 may be used to provide an appropriate body bias to the first, the first inner, and the second bodies 58, 82, 66, depending on whether the ON state or the OFF state of the first stacked body-contacted FET 46 is selected. As mentioned above, selection between the ON state and the OFF state normally occurs at a much lower frequency than the frequency of RF signals between the first and the second connection nodes 70, 72. Since the first body bias control signal 204 is based on OFF state or ON state selection, the frequency of the first body bias control signal 204 normally occurs at a much lower frequency than the frequency of RF signals between the first and the second connection nodes 70, 72. As such, the first body bias control signal 204 may have DC like influences on the first stacked body-contacted FET 46. To minimize the impact of such DC influences, the first, the second, and the third body bias resistive elements RB1, RB2, RB3 may have large values of resistance to isolate the first, the first inner, and the second bodies 58, 82, 66 from one another.

The first drain-to-source resistive element RDS1 is coupled between the first drain 50 and the first source 56, the second drain-to-source resistive element RDS2 is coupled between the first inner drain 84 and the first inner source 80, and the third drain-to-source resistive element RDS3 is coupled between the second drain 68 and the second source 62. During the OFF state, the first, the second, and the third drain-to-source resistive elements RDS1, RDS2, RDS3 may provide about equal voltage division across the first end, first inner, and the second end FETs 48, 74, 60.

In a first exemplary embodiment of the first stacked body-contacted FET 46, during the OFF state of the first stacked body-contacted FET 46, a magnitude of the first body bias control signal 204 is about equal to a magnitude of the first switch control signal 202, and during the ON state of the first stacked body-contacted FET 46, the magnitude of the first body bias control signal 204 is not equal to the magnitude of the first switch control signal 202.

In a second exemplary embodiment of the first stacked body-contacted FET 46, during the OFF state of the first stacked body-contacted FET 46, the magnitude of the first body bias control signal 204 is about equal to the magnitude of the first switch control signal 202, the magnitude of the first switch control signal 202 is negative relative to a DC voltage at the second connection node 72, and the magnitude of the first switch control signal 202 is negative relative to a DC voltage at the first connection node 70. During the ON state of the first stacked body-contacted FET 46, the magnitude of the first switch control signal 202 is positive relative to the magnitude of the first body bias control signal 204.

In a third exemplary embodiment of the first stacked body-contacted FET 46, during the OFF state of the first stacked body-contacted FET 46, the magnitude of the first body bias control signal 204 is about equal to the magnitude of the first switch control signal 202, the magnitude of the first switch control signal 202 is positive relative to the DC voltage at the second connection node 72, and the magnitude of the first switch control signal 202 is positive relative to the DC voltage at the first connection node 70. During the ON state of the first stacked body-contacted FET 46, the magnitude of the first switch control signal 202 is negative relative to the magnitude of the first body bias control signal 204.

In a fourth exemplary embodiment of the first stacked body-contacted FET 46, during the OFF state of the first stacked body-contacted FET 46, the first body bias control signal 204 is equal to between about −1 volt DC (VDC) and about −5 VDC, the first switch control signal 202 is equal to between about −1 VDC and about −5 VDC, the DC voltage at the second connection node 72 is equal to about zero volts, and the DC voltage at the first connection node 70 is equal to about zero volts. During the ON state of the first stacked body-contacted FET 46, the first body bias control signal 204 is equal to about zero VDC, the first switch control signal 202 is equal to between about 1 VDC and about 5 VDC, the DC voltage at the second connection node 72 is equal to about zero volts, and the DC voltage at the first connection node 70 is equal to about zero volts.

During the OFF state of the first stacked body-contacted FET 46, the first stacked body-contacted FET 46 has an OFF state impedance between the first and the second connection nodes 70, 72. During the ON state of the first stacked body-contacted FET 46, the first stacked body-contacted FET 46 has an ON state impedance between the first and the second connection nodes 70, 72. In the illustrated embodiment of the first stacked body-contacted FET 46, the first end, the first inner, and the second end FETs 48, 74, 60 are coupled in series between the first and the second connection nodes 70, 72. As such, three body-contacted FET elements are coupled in series. In an alternate embodiment of the first stacked body-contacted FET 46, the first inner FET 74 is omitted, such that the second drain 68 is directly coupled to the first source 56. As such, two body-contacted FET elements are coupled in series. In additional embodiments of the first stacked body-contacted FET 46, any number of body-contacted FET elements may be coupled in series.

Figure 16:
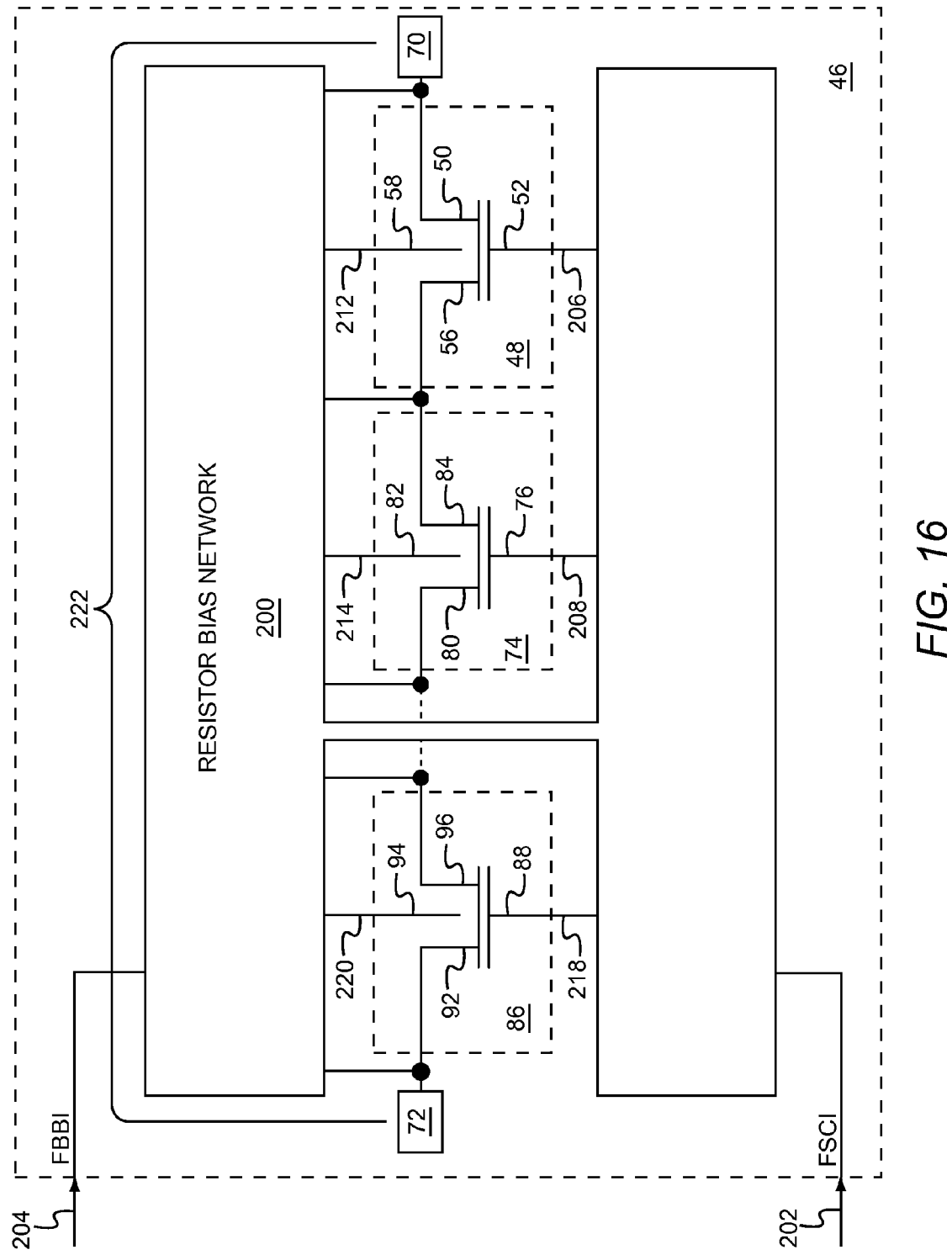
FIG. 16 is a schematic diagram showing the first stacked body-contacted FET according to an alternate embodiment of the first stacked body-contacted FET 46.

FIG. 16 is a schematic diagram showing the first stacked body-contacted FET 46 according to an alternate embodiment of the first stacked body-contacted FET 46. The first stacked body-contacted FET 46 illustrated in FIG. 16 is similar to the first stacked body-contacted FET 46 illustrated in FIG. 14, except the first stacked body-contacted FET 46 illustrated in FIG. 16 may include any number of body-contacted FET elements. The first stacked body-contacted FET 46 includes the first end FET 48, the first inner FET 74, and up to and including an MTH FET 86. The MTH FET 86 includes an $M^{TH}$ source 92, an $M^{TH}$ body 94, an $M^{TH}$ drain 96, and an $M^{TH}$ gate 88. The MTH FET 86 and any intervening body-contacted FET elements (not shown) between the first inner FET 74 and the MTH FET 86 may be similar to the first end FET 48 as previously described.

The first end FET 48, the first inner FET 74, and up to and including the MTH FET 86 are coupled in series between the second connection node 72 and the first connection node 70, such that the $M^{TH}$ source 92 is coupled to the second connection node 72, the $M^{TH}$ drain 96 is coupled to the first inner source 80 through any intervening body-contacted FET elements (not shown), the first inner drain 84 is coupled to the first source 56, and the first drain 50 is coupled to the first connection node 70. The resistor bias network 200 provides the first gate signal 206 to the first gate 52, the second gate signal 208 to the first inner gate 76, and an $N^{TH}$ gate signal 218 to the $M^{TH}$ gate 88. During operation of the first stacked body-contacted FET 46, the first switch control input FSCI may receive the first switch control signal 202, such that the first, the second, and up to and including the $N^{TH}$ gate signals 206, 208, 218 are based on the first switch control signal 202. The first switch control signal 202 is used to select either the ON state or the OFF state of the first stacked body-contacted FET 46.

The resistive bias network 200 provides the first body bias signal 212 to the first body 58, the second body bias signal 214 to the first inner body 82, and an $N^{TH}$ body bias signal 220 to the $M^{TH}$ body 94. During operation of the first stacked body-contacted FET 46, the first body bias input FBBI may receive the first body bias control signal 204, such that the first, the second, and up to and including the $N^{TH}$ body bias signals 212, 214, 220 are based on the first body bias control signal 204. The first body bias control signal 204 may be used to provide an appropriate body bias to the first, the first inner, and up to and including the $M^{TH}$ bodies 58, 82, 94, depending on whether the ON state or the OFF state of the first stacked body-contacted FET 46 is selected.

The first stacked body-contacted FET 46 includes a quantity of series coupled body-contacted FET elements equal to N, such that N is any positive whole number greater than one. An RF signal 222 between the first and the second connection nodes 70, 72 may be present due to the first stacked body-contacted FET 46 interacting with other circuit elements (not shown). In one embodiment of the first stacked body-contacted FET 46, a frequency of the RF signal 222 is greater than about 100 megahertz. During the OFF state of the first stacked body-contacted FET 46, the RF signal 222 may be distributed across the first end FET 48, the first inner FET 74, and up to and including the MTH FET 86. In an exemplary embodiment of the first stacked body-contacted FET 46, during the OFF state of the first stacked body-contacted FET 46, the RF signal 222 is distributed about equally across the first end FET 48, the first inner FET 74, and up to and including the MTH FET 86.

Figure 17:
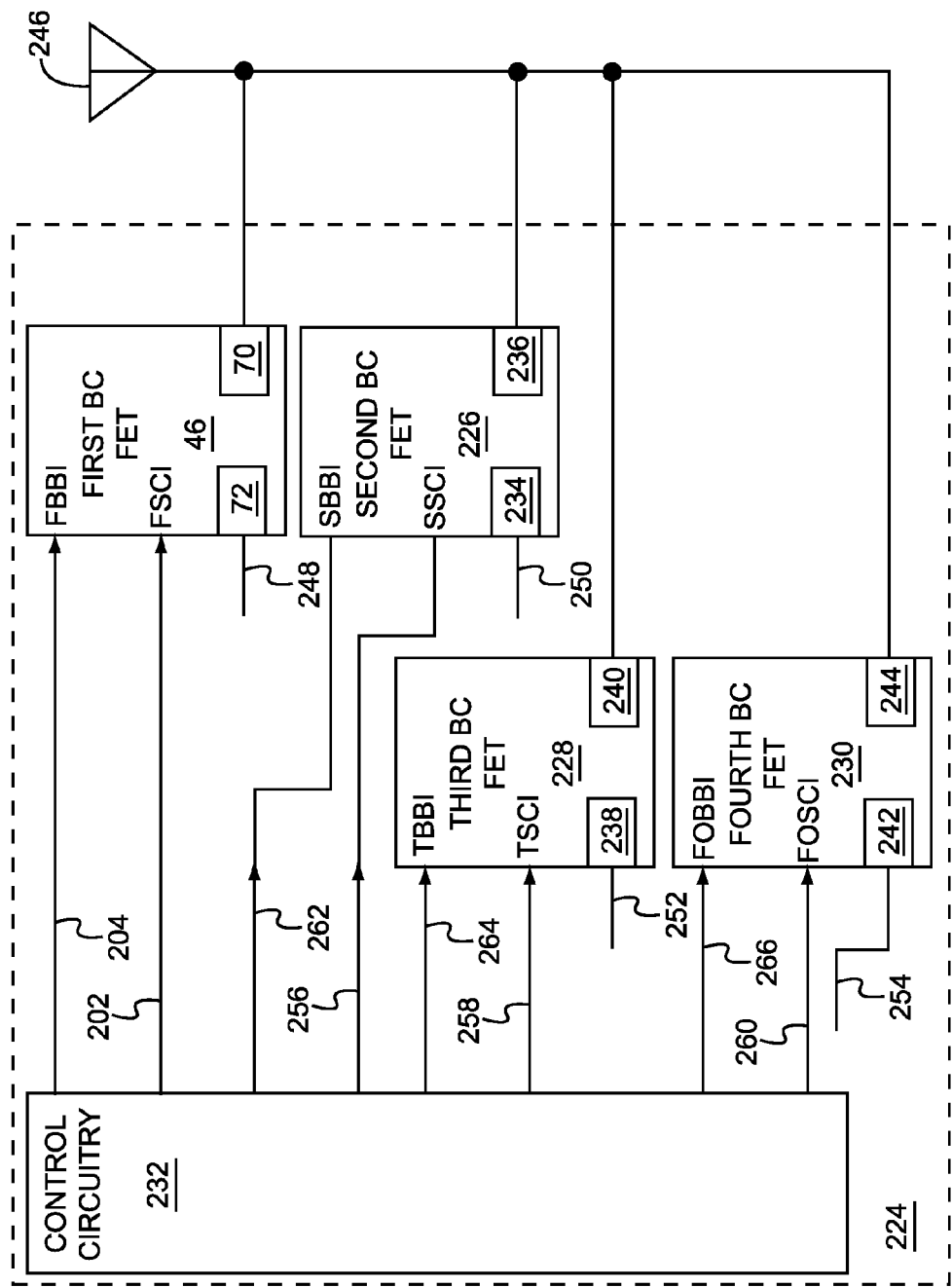
FIG. 17 shows an RF switch system according to one embodiment of the RF switch system.

FIG. 17 shows an RF switch system 224 according to one embodiment of the RF switch system 224. The RF switch system 224 provides four switched ports and includes the first stacked body-contacted FET 46, a second stacked body-contacted FET 226, a third stacked body-contacted FET 228, a fourth stacked body-contacted FET 230, and control circuitry 232. The second, the third, and the fourth body-contacted RF switches 226, 228, 230 may be similar to the first stacked body-contacted FET 46. The second stacked body-contacted FET 226 has a third switch connection node 234 and a fourth switch connection node 236, which may be similar to the second connection node 72 and the first connection node 70, respectively. Further, the second stacked body-contacted FET 226 has a second body bias input SBBI and a second switch control input SSCI, which may be similar to the first body bias input FBBI and the first switch control input FSCI, respectively.

The third stacked body-contacted FET 228 has a fifth switch connection node 238 and a sixth switch connection node 240, which may be similar to the second connection node 72 and the first connection node 70, respectively. Further, the third stacked body-contacted FET 228 has a third body bias input TBBI and a third switch control input TSCI, which may be similar to the first body bias input FBBI and the first switch control input FSCI, respectively.

The fourth stacked body-contacted FET 230 has a seventh switch connection node 242 and an eighth switch connection node 244, which may be similar to the second connection node 72 and the first connection node 70, respectively. Further, the fourth stacked body-contacted FET 230 has a fourth body bias input FOBBI and a fourth switch control input FOSCI, which may be similar to the first body bias input FBBI and the first switch control input FSCI, respectively.

Each of the first, the second, the third, and the fourth stacked body-contacted FETs 46, 226, 228, 230 provides a switched port of the RF switch system 224. The first, the fourth, the sixth, and the eighth connection nodes 70, 236, 240, 244 are coupled to an RF antenna 246. The second, the third, the fifth, and the seventh connection nodes 72, 234, 238, 242 provide a first port 248, a second port 250, a third port 252, and a fourth port 254, respectively. Therefore, the first, the second, the third, and the fourth body-contacted FETs 46, 226, 228, 230 allow the first, the second, the third, and the fourth ports 248, 250, 252, 254 to share the RF antenna 246. Any or all of the first, the second, the third, and the fourth ports 248, 250, 252, 254 may be coupled to RF transmit circuitry (not shown), RF receive circuitry (not shown), RF diplexers (not shown), RF duplexers (not shown), the like (not shown), or any combination thereof (not shown).

The control circuitry 232 provides the first switch control signal 202, a second switch control signal 256, a third switch control signal 258, and a fourth switch control signal 260 to the first switch control input FSCI, the second switch control input SSCI, the third switch control input TSCI, and the fourth switch control input FOSCI, respectively. The control circuitry 232 selects either the OFF state of the first stacked body-contacted FET 46 or the ON state of the first stacked body-contacted FET 46 and provides the first switch control signal 202 based on the selected one of the OFF state and the ON state to indicate which state was selected. The control circuitry 232 selects either an OFF state of the second stacked body-contacted FET 226 or an ON state of the second stacked body-contacted FET 226 and provides the second switch control signal 256 based on the selected one of the OFF state and the ON state to indicate which state was selected. The control circuitry 232 selects either an OFF state of the third stacked body-contacted FET 228 or an ON state of the third stacked body-contacted FET 228 and provides the third switch control signal 258 based on the selected one of the OFF state and the ON state to indicate which state was selected. The control circuitry 232 selects either an OFF state of the fourth stacked body-contacted FET 230 or an ON state of the fourth stacked body-contacted FET 230 and provides the fourth switch control signal 260 based on the selected one of the OFF state and the ON state to indicate which state was selected.

The control circuitry 232 provides the first body bias control signal 204, a second body bias control signal 262, a third body bias control signal 264, and a fourth body bias control signal 266 to the first body bias input FBBI, the second body bias input SBBI, the third body bias input TBBI, and the fourth body bias input FOBBI, respectively. The control circuitry 232 provides the first body bias control signal 204 based on the selected one of the OFF state and the ON state of the first stacked body-contacted FET 46 to provide the appropriate body biasing to the body-contacted FET elements (not shown) in the first stacked body-contacted FET 46. The control circuitry 232 provides the second body bias control signal 262 based on the selected one of the OFF state and the ON state of the second stacked body-contacted FET 226 to provide the appropriate body biasing to the body-contacted FET elements (not shown) in the second stacked body-contacted FET 226. The control circuitry 232 provides the third body bias control signal 264 based on the selected one of the OFF state and the ON state of the third stacked body-contacted FET 228 to provide the appropriate body biasing to the body-contacted FET elements (not shown) in the third stacked body-contacted FET 228. The control circuitry 232 provides the fourth body bias control signal 266 based on the selected one of the OFF state and the ON state of the fourth stacked body-contacted FET 230 to provide the appropriate body biasing to the body-contacted FET elements (not shown) in the fourth stacked body-contacted FET 230.

Alternate embodiments of the RF switch system 224 may omit any or all of the second, the third, and the fourth body-contacted FETs 226, 228, 230, or may include additional body-contacted RF switches (not shown). Further, the body-contacted RF switches may be arranged in any manner.

Figure 18:
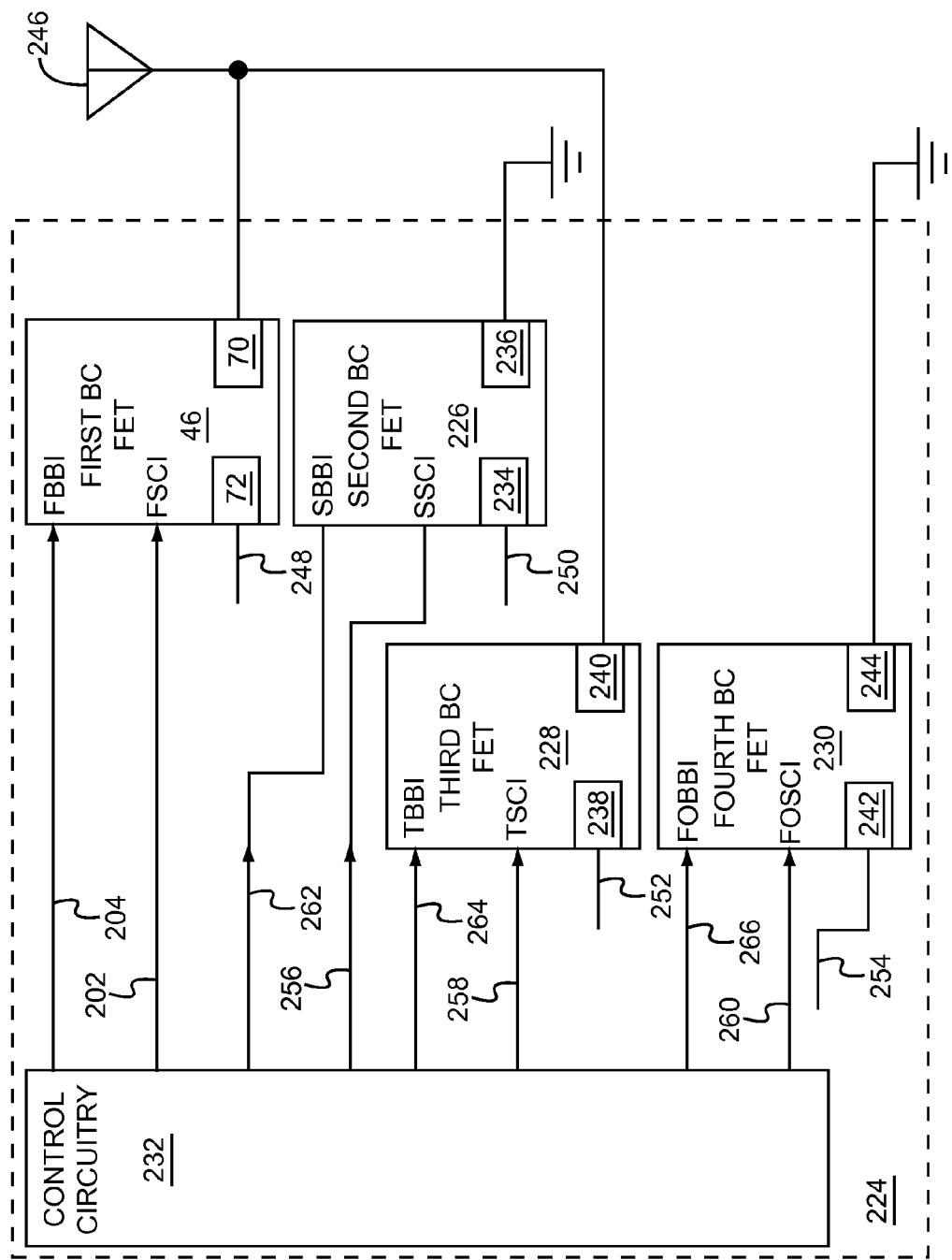
FIG. 18 shows the RF switch system according to an alternate embodiment of the RF switch system.

FIG. 18 shows the RF switch system 224 according to an alternate embodiment of the RF switch system 224. The RF switch system 224 illustrated in FIG. 18 is similar to the RF switch system 224 illustrated in FIG. 17 except the RF switch system 224 illustrated in FIG. 18 uses the second, the third, and the fourth body-contacted FETs 226, 228, 230 in a different manner. In FIG. 17, the first, the fourth, the sixth, and the eighth connection nodes 70, 236, 240, 244 are coupled to the RF antenna 246. The second, the third, the fifth, and the seventh connection nodes 72, 234, 238, 242 provide the first, the second, the third, and the fourth ports 248, 250, 252, 254, respectively. In FIG. 18, the third and the fourth ports 252, 254 are omitted. The second and the third connection nodes 72, 234 provide the first port 248, and the fifth and the seventh switch connection nodes 238, 242 provide the second port 250. The first and the sixth connection nodes 70, 240 are coupled to the RF antenna 246, and the fourth and the eighth switch connection nodes 236, 244 are coupled to ground. As such, the second and the fourth body-contacted FETs 226, 230 function as shunt switches.

Normally, when the first stacked body-contacted FET 46 is in the OFF state, the second stacked body-contacted FET 226 is in the ON state and vice versa. By coupling the second connection node 72 to ground when the first stacked body-contacted FET 46 is in the OFF state and the second stacked body-contacted FET 226 is in the ON state may improve isolation characteristics of the first stacked body-contacted FET 46. Similarly, normally, when the third stacked body-contacted FET 228 is in the OFF state, the fourth stacked body-contacted FET 230 is in the ON state and vice versa. By coupling the fifth switch connection node 238 to ground when the third stacked body-contacted FET 228 is in the OFF state and the fourth stacked body-contacted FET 230 is in the ON state may improve isolation characteristics of the third stacked body-contacted FET 228. Alternate embodiments of the RF switch system 224 may omit any or all of the second, the third, and the fourth body-contacted FETs 226, 228, 230, or may include additional body-contacted RF switches (not shown). Further, the body-contacted RF switches may be arranged in any manner.

Figure 19:
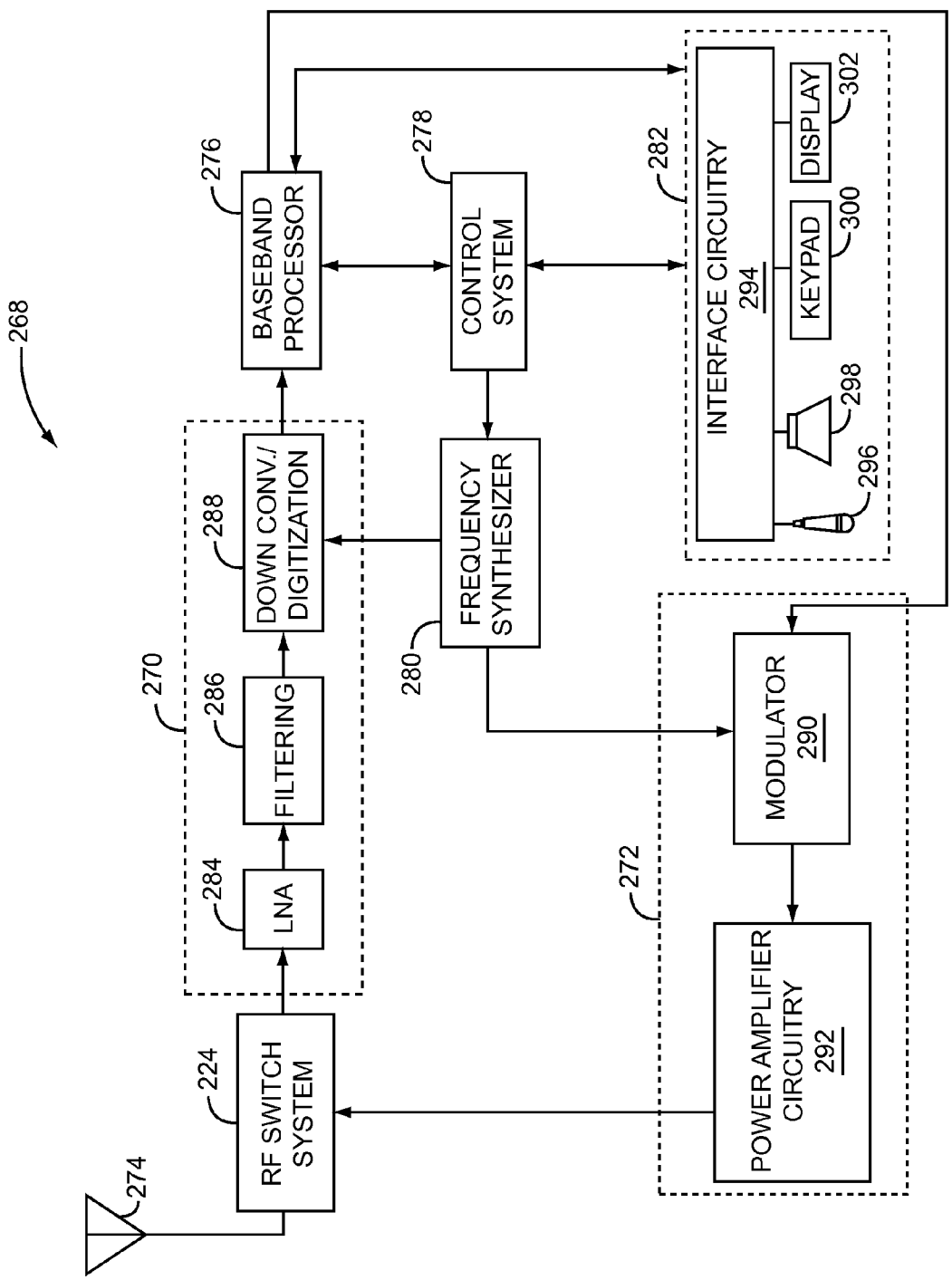
FIG. 19 shows an application example of the present disclosure used in a mobile terminal.

An application example of the RF switch system 224 is its use in a mobile terminal 268, the basic architecture of which is represented in FIG. 19. The mobile terminal 268 may include a receiver front end 270, a radio frequency transmitter section 272, an antenna 274, the RF switch system 224, a baseband processor 276, a control system 278, a frequency synthesizer 280, and an interface 282. The receiver front end 270 receives information bearing radio frequency signals from one or more remote transmitters provided by a base station (not shown). A low noise amplifier (LNA) 284 amplifies the signal. A filter circuit 286 minimizes broadband interference in the received signal, while down conversion and digitization circuitry 288 down converts the filtered, received signal to an intermediate or baseband frequency signal, which is then digitized into one or more digital streams. The receiver front end 270 typically uses one or more mixing frequencies generated by the frequency synthesizer 280. The baseband processor 276 processes the digitized received signal to extract the information or data bits conveyed in the received signal. This processing typically comprises demodulation, decoding, and error correction operations. As such, the baseband processor 276 is generally implemented in one or more digital signal processors (DSPs).

On the transmit side, the baseband processor 276 receives digitized data, which may represent voice, data, or control information, from the control system 278, which it encodes for transmission. The encoded data is output to the transmitter 272, where it is used by a modulator 290 to modulate a carrier signal that is at a desired transmit frequency. Power amplifier circuitry 292 amplifies the modulated carrier signal to a level appropriate for transmission, and delivers the amplified and modulated carrier signal to the antenna 274 through the RF switch system 224.

A user may interact with the mobile terminal 268 via the interface 282, which may include interface circuitry 294 associated with a microphone 296, a speaker 298, a keypad 300, and a display 302. The interface circuitry 294 typically includes analog-to-digital converters, digital-to-analog converters, amplifiers, and the like. Additionally, it may include a voice encoder/decoder, in which case it may communicate directly with the baseband processor 276. The microphone 296 will typically convert audio input, such as the user's voice, into an electrical signal, which is then digitized and passed directly or indirectly to the baseband processor 276. Audio information encoded in the received signal is recovered by the baseband processor 276, and converted by the interface circuitry 294 into an analog signal suitable for driving the speaker 298. The keypad 300 and display 302 enable the user to interact with the mobile terminal 268, input numbers to be dialed, address book information, or the like, as well as monitor call progress information.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor die comprising a first stacked body-contacted field effect transistor (FET) comprising:
    a first plurality of FETs coupled in series comprising:
        a first end FET having a first drain, a first gate, a first merged source-drain, and a first body, which is not directly connected to any body of any other of the first plurality of FETs, such that the first merged source-drain is adapted to function as a first source of the first end FET; and
        a second end FET having a second source, a second gate, and a second body, which is not directly connected to any body of any other of the first plurality of FETs; and
    a lateral isolation band encircling a periphery of the first plurality of FETs, wherein the lateral isolation band laterally isolates the first plurality of FETs from other devices in the semiconductor die.

2. The semiconductor die of claim 1 wherein:
    an insulating layer of the semiconductor die contacts the lateral isolation band and vertically isolates the first plurality of FETs from other layers of the semiconductor die below the insulating layer;
    a thin-film semiconductor device layer of the semiconductor die is over the insulating layer;
    a source, a drain, and a body of each of the first plurality of FETs is formed in at least a part of the thin-film semiconductor device layer; and
    control circuitry is adapted to during an OFF state of each of the first plurality of FETs, provide each body of the first plurality of FETs a body bias signal, such that each body and each corresponding source of the first plurality of FETs are reverse biased and each body and each corresponding drain of the first plurality of FETs are reverse biased to provide reverse body biasing to the plurality of FETs.

3. The semiconductor die of claim 2 wherein the first merged source-drain is further adapted to function as a second drain of the second end FET.

4. The semiconductor die of claim 2 wherein the first plurality of FETs further comprises a first inner FET having a first inner gate, a first inner merged source-drain, and a first inner body, which is not directly connected to any body of any other of the first plurality of FETs, such that the first inner merged source-drain is adapted to function as a first inner source of the first inner FET and to function as a second drain of the second end FET, and the first merged source-drain is further adapted to function as a first inner drain of the first inner FET.

5. The semiconductor die of claim 2 wherein the first plurality of FETs further comprises a first plurality of inner FETs coupled between the first end FET and the second end FET, such that each of the first plurality of inner FETs has an inner gate, an inner merged source-drain, and an inner body, which is not directly connected to any body of any other of the first plurality of FETs, such that an inner merged source-drain of one of the first plurality of inner FETs is adapted to function as a source of the one of the first plurality of inner FETs and to function as a second drain of the second end FET, and the first merged source-drain is adapted to function as a drain of another of the first plurality of inner FETs.

6. The semiconductor die of claim 2 wherein:
    the first stacked body-contacted FET has an active area;
    the first drain comprises a plurality of fingers in the active area;
    the first body comprises a plurality of fingers in the active area;
    the first gate comprises a plurality of fingers, such that each of the plurality of fingers of the first gate is over a corresponding one of the plurality of fingers of the first body;
    the first merged source-drain comprises a plurality of fingers in the active area;
    the second source comprises a plurality of fingers in the active area;
    the second body comprises a plurality of fingers in the active area; and
    the second gate comprises a plurality of fingers, such that each of the plurality of fingers of the second gate is over a corresponding one of the plurality of fingers of the second body.

7. The semiconductor die of claim 6 wherein:
    the first end FET further comprises:
        a first body finger interconnect region outside of the active area on one side of the active area; and
        a plurality of finger extensions of the first body, such that each finger extension of the first body is between and electrically connects an end of a corresponding one of the plurality of fingers of the first body and the first body finger interconnect region; and the second end FET further comprises:
  a second body finger interconnect region outside of the active area on an opposite side of the active area; and
  a plurality of finger extensions of the second body, such that each finger extension of the second body is between and electrically connects an end of a corresponding one of the plurality of fingers of the second body and the second body finger interconnect region.

8. The semiconductor die of claim 7 wherein:
the first end FET further comprises:
  a first gate finger interconnect region outside of the active area on the one side of the active area; and
  a plurality of finger extensions of the first gate, such that each finger extension of the first gate is between and electrically connects an end of a corresponding one of the plurality of fingers of the first gate and the first gate finger interconnect region; and
the second end FET further comprises:
  a second gate finger interconnect region outside of the active area on the opposite side of the active area; and
  a plurality of finger extensions of the second gate, such that each finger extension of the second gate is between and electrically connects an end of a corresponding one of the plurality of fingers of the second gate and the second gate finger interconnect region.

9. The semiconductor die of claim 8 wherein:
a width of each of the plurality of finger extensions of the first body is about equal to a width of each of the plurality of finger extensions of the first gate; and
a width of each of the plurality of finger extensions of the second body is about equal to a width of each of the plurality of finger extensions of the second gate.

10. The semiconductor die of claim 8 wherein:
a width of each of the plurality of finger extensions of the first body is greater than a width of each of the plurality of finger extensions of the first gate; and
a width of each of the plurality of finger extensions of the second body is greater than a width of each of the plurality of finger extensions of the second gate.

11. The semiconductor die of claim 8 wherein:
a width of each of the plurality of finger extensions of the first body is less than a width of each of the plurality of finger extensions of the first gate; and
a width of each of the plurality of finger extensions of the second body is less than a width of each of the plurality of finger extensions of the second gate.

12. The semiconductor die of claim 8 wherein:
the first end FET further comprises a first body contact region adjacent and electrically connected to the first body finger interconnect region and outside of the active area; and
the second end FET further comprises a second body contact region adjacent and electrically connected to the second body finger interconnect region and outside of the active area.

13. The semiconductor die of claim 12 wherein:
the first body contact region and the first gate finger interconnect region have a body contact region to gate finger interconnect region overlap, such that at least a portion of the first gate finger interconnect region is between the first body contact region and the active area; and
the second body contact region and the second gate finger interconnect region have the body contact region to gate finger interconnect region overlap, such that at least a portion of the second gate finger interconnect region is between the second body contact region and the active area.

14. The semiconductor die of claim 12 wherein:
a pwell provides the plurality of fingers of the first body, the plurality of fingers of the second body, the plurality of finger extensions of the first body, the plurality of finger extensions of the second body, the first body finger interconnect region, and the first body finger interconnect region;
a P+ implant provides the first body contact region and the second body contact region;
an N+ implant provides the plurality of fingers of the first drain, the plurality of fingers of the second source, and the plurality of fingers of the first merged source-drain; and
polysilicon provides the plurality of fingers of the first gate, the plurality of fingers of the second gate, the plurality of finger extensions of the first gate, the plurality of finger extensions of the second gate, the first gate finger interconnect region, and the second gate finger interconnect region.

15. The semiconductor die of claim 14 wherein the N+ implant extends through the thin-film semiconductor device layer to the insulating layer.

16. The semiconductor die of claim 15 wherein the thin-film semiconductor device layer is a silicon-on-insulator (SOI) thin-film semiconductor device layer and the SOI thin-film semiconductor device layer is fully-depleted SOT.

17. The semiconductor die of claim 14 wherein the first body contact region and the second body contact region contain no implants that would impede an electrical connection between the P+ implant and the pwell.

18. The semiconductor die of claim 2 wherein the thin-film semiconductor device layer is a silicon-on-insulator (SOI) thin-film semiconductor device layer.

19. The semiconductor die of claim 2 wherein a thickness of the thin-film semiconductor device layer is less than or equal to about 400 nanometers.

* * * * *